(12) United States Patent
Lee

(10) Patent No.: US 9,001,545 B2
(45) Date of Patent: Apr. 7, 2015

(54) NOR-BASED BCAM/TCAM CELL AND ARRAY WITH NAND SCALABILITY

(71) Applicant: Aplus Flash Technology, Inc., Fremont, CA (US)

(72) Inventor: Peter Wung Lee, Saratoga, CA (US)

(73) Assignee: Aplus Flash Technology, Inc., Fremont, CA (US)

( * ) Notice: Subject to any disclaimer, the term of this patent is extended or adjusted under 35 U.S.C. 154(b) by 0 days.

(21) Appl. No.: 14/016,089

(22) Filed: Aug. 31, 2013

(65) Prior Publication Data

US 2014/0347933 A1 Nov. 27, 2014

Related U.S. Application Data

(60) Provisional application No. 61/743,333, filed on Aug. 31, 2012.

(51) Int. Cl.
*G11C 15/00* (2006.01)
*G11C 15/04* (2006.01)
*G11C 16/04* (2006.01)

(52) U.S. Cl.
CPC .......... *G11C 15/046* (2013.01); *G11C 16/0483* (2013.01)

(58) Field of Classification Search
USPC ............. 365/185.01, 185.03, 185.17, 49.1, 365/49.17, 49.18
See application file for complete search history.

(56) References Cited

U.S. PATENT DOCUMENTS

| | | |
|---|---|---|
| 6,181,591 B1 | 1/2001 | Miyatake et al. |
| 6,191,973 B1 | 2/2001 | Moyer |
| 6,256,216 B1 | 7/2001 | Lien et al. |
| 6,269,016 B1 | 7/2001 | Moyer |
| 6,374,325 B1 | 4/2002 | Simpson et al. |
| 6,411,538 B1 | 6/2002 | Kengeri |
| 6,512,685 B1 | 1/2003 | Lien et al. |
| 6,567,340 B1 | 5/2003 | Nataraj et al. |
| 6,661,687 B1 | 12/2003 | Lien et al. |

(Continued)

OTHER PUBLICATIONS

Nitin Mohan, Low-Power High-Performance Ternary Content Addressable Memory Circuits, a Ph.D. Thesis presented to the University of Waterloo, Department of Electrical and Computer Engineering. Waterloo, Ontario, Canada, 2006, p. 1-156. https://uwspace.uwaterloo.ca/bitstream/handle/10012/2873/n2mohan2006.pdf?sequence=1.

(Continued)

*Primary Examiner* — Fernando Hidalgo
(74) *Attorney, Agent, or Firm* — Raywell Group, LLC

(57) ABSTRACT

This invention discloses a 2T-string NOR-based CAM logic cell comprising two physical NAND cells connected in series with two horizontal WLs and one vertical BL and one vertical SL. Additionally, a sector of NOR-based CAM logic cell array is configured with N vertical cell strings each including M 2T-string NOR-based CAM logic cells connected in parallel sharing a local vertical SL and one dedicated vertical ML as an Operand word vertical page. Each 2T-string NOR-based CAM logic cell can be either a binary or ternary CAM cell associated with two or three physical states assigned to NAND cells' Vt levels for defining CAM logic states. Logic match of M-logic-bit inputs is found for at least one vertical page if the corresponding M 2T-string NOR-based CAM logic cells are in non-conduction state, providing M times faster Compare performance over the NAND-based CAM and 2 time faster than SRAM-based CAM.

31 Claims, 14 Drawing Sheets

2T-string NOR-based CAM

Definition of logic states in a NOR-based BCAM

| Logic State | MT Vt | MB Vt | WLM | WLMB | Matched? |
|---|---|---|---|---|---|
| '0' | Vt0 (0) | Vt1 (1) | 0 | VDD (1) | No |
| '1' | Vt1 (1) | Vt0 (0) | VDD (1) | 0 | No |
| '0' | Vt0 (0) | Vt1 (1) | VDD (1) | 0 | Yes |
| '1' | Vt1 (1) | Vt0 (0) | 0 | VDD (1) | Yes |

Vt0 < 0 < Vt1 < VDD

(56) References Cited

U.S. PATENT DOCUMENTS

| | | |
|---|---|---|
| 6,700,827 B2 | 3/2004 | Lien et al. |
| 6,944,710 B2 | 9/2005 | Regev et al. |
| 7,003,624 B2 | 2/2006 | Regev et al. |
| 7,016,211 B2 | 3/2006 | Park et al. |
| 7,257,670 B2 | 8/2007 | Feldmeier |
| 7,379,314 B1 | 5/2008 | Sun |
| 7,675,765 B2 | 3/2010 | Derharcobian et al. |
| 7,688,612 B2 | 3/2010 | Lee et al. |
| 7,830,713 B2 | 11/2010 | Lee et al. |
| 7,848,129 B1 | 12/2010 | Deshpande et al. |
| 8,031,502 B2 | 10/2011 | Kim |
| 8,072,811 B2 | 12/2011 | Lee et al. |
| 8,120,959 B2 | 2/2012 | Lee et al. |
| 8,120,966 B2 | 2/2012 | Lee |
| 8,144,493 B2 | 3/2012 | Ahn |
| 8,149,622 B2 | 4/2012 | Lee et al. |
| 8,169,808 B2 | 5/2012 | Roohparvar |
| 8,233,320 B2 | 7/2012 | Lee et al. |
| 2009/0279360 A1* | 11/2009 | Lee et al. ............ 365/185.17 |
| 2009/0310414 A1* | 12/2009 | Lee et al. ............ 365/185.17 |
| 2010/0195404 A1* | 8/2010 | Lee ..................... 365/185.22 |
| 2010/0329011 A1* | 12/2010 | Lee et al. ............ 365/185.17 |
| 2011/0157982 A1* | 6/2011 | Lee et al. ............ 365/185.03 |
| 2014/0025881 A1* | 1/2014 | Joshi et al. ................ 711/108 |

OTHER PUBLICATIONS

Midas Peng and Sherri Azgomi, Content-Addressable Memory (CAM) and Its Network Applications, Altera International Ltd., EE Times Asia (online), International IC, 2000, May 3, Taipei Conference Proceedings 3. http://www.eetasia.com/ARTICLES/2000MAY/2000MAY03_MEM_NTEK_TAC.PDF.

\* cited by examiner

Definition of logic states in a 6T1b DRAM-based

| Logic State | Vx (V) | Vy (V) |
|---|---|---|
| '0' | 0 | VDD |
| '1' | VDD | 0 |

FIG.1B
(Prior Art)

Definition of logic states in a 10T1b SRAM-based BCAM cell

| Logic State | Vx (V) | Vy (V) |
|---|---|---|
| '0' | 0 | VDD |
| '1' | VDD | 0 |

FIG.2B
(Prior Art)

Definition of logic states in a
16T1b SRAM-based TCAM cell

| Logic State | Vx (V) | Vy (V) |
|---|---|---|
| '0' | 0 | VDD |
| '1' | VDD | 0 |
| 'X' | 0 | 0 |

FIG.3B
(Prior Art)

Definition of logic states in a NOR-based BCAM

| Logic State | MT Vt   | MB Vt   | WLM     | WLMB    | Matched? |
|-------------|---------|---------|---------|---------|----------|
| '0'         | Vt0 (0) | Vt1 (1) | 0       | VDD (1) | No       |
| '1'         | Vt1 (1) | Vt0 (0) | VDD (1) | 0       | No       |
| '0'         | Vt0 (0) | Vt1 (1) | VDD (1) | 0       | Yes      |
| '1'         | Vt1 (1) | Vt0 (0) | 0       | VDD (1) | Yes      |

Vt0 < 0 < Vt1 < VDD

FIG. 5D

Definition of logic states in a NOR-based TCAM

| Logic State | MT Vt  | MB Vt  | WLM     | WLMB    | Matched? |
|-------------|--------|--------|---------|---------|----------|
| '0'         | Vt0(0) | Vt1(1) | 0       | VDD(1)  | No       |
| '1'         | Vt1(1) | Vt0(0) | VDD(1)  | 0       | No       |
| '0'         | Vt0(0) | Vt1(1) | VDD(1)  | 0       | Yes      |
| '1'         | Vt1(1) | Vt0(0) | 0       | VDD(1)  | Yes      |
| 'X1'        | Vt2(X) | X      | X       | X       | X        |
| 'X2'        | X      | Vt2(X) | X       | X       | X        |

$Vt0 < 0 < Vt1 < VDD < Vt2$

FIG. 5E

NOR-BASED BCAM/TCAM CELL AND ARRAY WITH NAND SCALABILITY

CROSS-REFERENCES TO RELATED APPLICATIONS

This application claims priority to U.S. Provisional Patent Application No. 61/743,333, filed on Aug. 31, 2012, commonly assigned, and hereby incorporated by reference in its entirety herein for all purposes.

Additionally, this application is related to U.S. Pat. Nos. 8,120,966, 8,120,959, 8,072,811, 7,688,612, 7,830,713, 8,233,320, 8,149,622, and U.S. patent application Ser. Nos. 13/135,220, 13/199,785, 13/199,527, 12/807,997, 61/275,148, 61/277,208, 61/574,632, and 61/687,227, commonly assigned, which are incorporated by reference herein for all purposes.

This application is further related to a thesis paper of "Low-power High-performance Ternary Content Addressable Memory Circuits" presented by Mr. Nitin Moham to University of Waterloo, Ontario, Canada.

Furthermore, this application is related to the following U.S. Pat. Nos. 7,848,129, 6,411,538, 6,567,340, 6,700,827, 7,016,211, 8,169,808, 8,031,502, 7,003,624, 6,256,216, and 8,144,493.

TECHNICAL FIELD OF THE INVENTION

Embodiments of the present invention relate generally to an extremely high-density non-volatile NOR-based BCAM (Binary Content-addressable Memory) or TCAM (Ternary Content-addressable Memory) memory cell devices and arrays that allow to achieve the high NAND-like cell scalability, similar low-power FN page Write scheme, low-cost and non-volatile capability. More specifically, the present invention provides not only a faster compare function over the rivaled NAND-based CAM cell but also faster operations over both SRAM-based BCAM/TCAM cell and the DRAM-based BCAM/TCAM cell due to less resistance used in a comparator circuit including one 2T-string NAND cells storing two complementary threshold voltage (Vt) states, Vt0 (−2.0V) and Vt1 (0.7V) and using two combinations of the two Vt states in the two NAND cells for defining two logic states of the CAM cell.

Furthermore, unlike VM-based CAM, the NOR-based CAM cell and array of the present invention can be flexibly and easily configured into BCAM (Binary CAM) cell, TCAM (Ternary CAM) cell or HCAM (Hybrid CAM) cell or vise versa. In one or more embodiments, converting BCAM cell to TCAM cell is accomplished by adding the third "Don't-care" logic state to two existing "0" and "1" logic states of a BCAM cell without adding any extra transistors. Specifically, the "Don't-care" logic state is achieved by adding Vt2 to BCAM's Vt0 and Vt1. The Vt2 value is preferably set to be higher than VDD with a sensible margin for many emerging applications requiring fast "matching or comparing" function for high-density and low-cost.

BACKGROUND OF INVENTION

The Content Addressable Memory (CAM) comprises three major kinds of cell structures today. These three CAM cell structures include two key VM-based (volatile) CAM cells and one NVM-based (Non-volatile) CAM cell. The VM-based CAM cell includes the DRAM-based CAM and the SRAM-based CAM cells, while the NVM-based CAM cell includes the NAND-based CAM and NOR-based CAM cells. There were many prior art of SRAM-based CAM cells and DRAM-based CAM cells.

Up to date, the SRAM-based CAM cell greatly outperforms the DRAM-based CAM cell and dominates the VM-based CAM market. It is because no power-hungry refresh cycle is needed in any SRAM-based CAM cell design.

There were few NVM-based CAM cells proposed until a NAND-based CAM cell structure was presented in U.S. Pat. No. 8,169,808, entitled "NAND FLASH CONTENT ADDRESSABLE MEMORY."

Apart from two traditional functions of "Read and Write" of the regular memories such as DRAM, SRAM, EEPROM, NOR and NAND, a CAM cell has the third additional function of "Compare."

In normal Read operation of regular memory, the plurality of input pins are applied with the address bits and then memory will respond it by outputting the corresponding addressed Byte or Word data within Tacc time, depending on x8 or x16 configuration of the addressed memory.

By contrast, in CAM memory's normal Compare operation, the plurality of input pins are applied with the data bits and then CAM memory will perform Compare or Search function and then respond to it by outputting the corresponding address within the Tacc time if a match is found. If more than a single match has occurred, then an on-chip priority encoder will decide and output the right address of the matched data.

So far, the DRAM-based CAM has been gradually phased out in market place due to its disadvantageous need for its constant refresh-cycle that consumes too much power and is prone to data loss. Conversely, the SRAM-based CAM does not require the refresh cycle to sustain its stored data but it suffers disadvantages of the big cell size and the risk of losing the VM stored data once the VDD power is removed.

Unlike the above mentioned the VM-based CAM cells, DRAM-based CAM cell and the SRAM-based CAM cell, Micron's NAND-based CAM cell is NVM-based CAM cell that has the advantages of small cell size and zero risk of losing data when VDD power is shut off. But the disadvantage of the NAND-based CAM cell is the slow 20 µs Compare speed. The typical speed difference between DRAM-based and SRAM-based CAM cells is less than 100 ns.

Traditionally, there are two types of CAM cells such as BCAM and TCAM. The BCAM cell stands for the Binary CAM cell that stores two logic states such as "1" and "0", while the TCAM cell stands for Ternary CAM cell that stores three logic states such as "1", "0" and "X". The "X" stands for the "Don't-care" state.

But Ternary CAM cell is never equal to BCAM cell in terms of number of transistors in all prior arts of DRAM-based CAM cell, SRAM-based CAM cell and NAND-based CAM cell. Typically, each TCAM cell size is much larger than each BCAM cell size because TCAM needs to add extra devices to add the third "X" logic state. One exemplary SRAM-based TCAM cell comprises sixteen (16) transistors, while the SRAM-based BCOM cell comprises ten (10) transistors.

Both VM-based BCAM or TCAM cells are taking too much silicon area because it comprises two circuit parts. The first circuit part is a "Latch" to store the CAM's bit data and the second circuit part is a "Comparator", which is used to perform Compare function.

By contrast, the NVM-based BCAM or TCAM cells take much smaller silicon area because it combines both functions of "Latch" and "Compare" into one die due to its non-volatile storage characteristics. But NVM NAND-based BCAM cannot be easily converted into NAND-based TCAM because the inherent cell string limitation.

In light of the above pros and cons of CAMs of prior art, the present invention of the preferred NOR-based CAM cell and array is aimed at solving the above cons and disadvantages.

SUMMARY OF THE INVENTION

Embodiments of the present invention relate generally to an extremely high-density non-volatile NOR-based BCAM (Binary Content-addressable Memory) or TCAM (Ternary Content-addressable Memory) memory cell devices and arrays that allow to achieve the high NAND-like cell scalability, similar low-power FN page Write scheme, low-cost and non-volatile capability. More specifically, the present invention provides not only a faster compare function over the rivaled NAND-based CAM cell but also faster operations over both SRAM-based BCAM/TCAM cell and the DRAM-based BCAM/TCAM cell due to less resistance used in a comparator circuit including 2T-string NAND cells storing two complementary threshold voltage (Vt) states, Vt0 (−2.0V) and Vt1 (0.7V) and using two combinations of the two Vt states in the two NAND cells for defining two logic states of the CAM cell.

The first object of the present invention is to provide a preferable universal NMOS NOR-based CAM cell with one paired NAND cells, MT and MB, forming a 2T-string connected in series with two complementary horizontal WL gates and one paired vertical BL and vertical SL.

The second object of this invention is to provide a preferred two (2) Vt assignments, a negative Vt0 (data "0") and a small positive Vt1 (data "1") less than VDD, for a NMOS 2T-string BCAM cell that stores two (2) logic states.

The third object of this invention is to provide a preferred three (3) Vt assignments, a negative Vt0 (data "0"), a small positive Vt1 (data "1") less than VDD and a large positive Vt2 (data "X") greater than VDD for a NMOS 2T-string TCAM cell that stores more than two logic states.

The fourth object of this invention is to provide a preferred sector of a BCAM cell array that comprises a plurality of basic NOR-based CAM cells, each of which stores two binary Vts, Vt0 and Vt1, for two Logic states of "0" and "1".

The fifth object of this invention is to provide a preferred sector of a TCAM cell array that comprises a plurality of basic NOR-based TCAM cells, each of which stores three Vt levels, Vt0, Vt1 and Vt2, respectively for three logic states of "0", "1" and "X".

The sixth object of this invention is to further define two referred "don't-care" logic states, "X1" and "X2". The "X1" Logic state is preferably defined as when the MT's Vt level is Vt2 but MB's Vt level is "don't-care" that can be either Vt0 or Vt1. Conversely, the "X2" Logic state is defined as when the MB's Vt level is Vt2 but MT's Vt level is "don't-care" that can be either Vt0 or Vt1.

The seventh object of this invention is to provide a preferred sector of a HCAM cell array that comprises a plurality of hybrid pages. HCAM stands for the NOR-based Hybrid CAM array. Some of HCAM pages can be programmed into TCAM pages, and the remaining of whole HCAM pages CAM pages can be programmed into NOR-based BCAM pages. The number of transistors of both BCAM and TCAM pages and the WL decoders are kept identical. The BCAM and TCAM pages can be flexibly mixed in arbitrary manner in terms of the page numbers and the page physical location.

The eighth object of the present invention is to provide a sector of M×N 2T-string NOR-based CAM logic cell array with M-logic-bit match capability and N MLs for N vertical pages of Comparand words. One or multiple matches can be found in BCAM, TCAM and HCAM sectors of the present invention.

The ninth object of the present invention is to assign two preferred complementary Vt states for a BCAM cell. The two Vt values include Vt0 with a preferable negative value of −2.0V and Vt1 with a small positive value of +0.7V but less than VDD. The Vt0 state is a "0" erased state with a wider Vt distribution, while Vt1 state is a "1" programmed state with a narrow Vt distribution done by the bit-by-bit Program and Program-Verify operations.

The tenth object of the present invention is to assign three preferred Vt levels for a TCAM cell. The three Vt levels include Vt0 with a preferable negative value of −2.0V, Vt1 with a small positive value of +0.7V (less than VDD voltage) and Vt2 with a larger positive value of +2.0V (larger than VDD voltage).

Similarly, the Vt0 state is a "0" erased state with a wider Vt distribution, while Vt1 and Vt2 states are a "1" and "X" programmed states with a narrow Vt distribution done by the bit-by-bit Program and Program-Verify operations. The Vt2 value is preferably defined higher than VDD voltage in operation.

The eleventh object of the present invention is to disclose the preferable M×N 2T-string NOR-based BCAM/TCAM logic cell array with a preferable Priority Encoder that allows one or more (from 1 to N) MLs.

The twelfth object of the present invention is to disclose the preferable M×N 2T-string NOR-based BCAM/TCAM cell array with a preferred Program, Program-Inhibit, and Erase scheme and flow.

In a specific embodiment, the present invention provides a 2T-string NOR-based CAM logic cell circuit with NAND scalability. The 2T-string NOR-based CAM logic cell includes a first NAND flash transistor connected a second NAND flash transistor in series. The first NAND flash transistor includes a first gate coupled to a first word line and a drain node coupled to a vertical bit line. The second NAND flash transistor includes a second gate coupled to a second word line and a source node coupled to a vertical source line. Each of the first NAND flash transistor and the second NAND flash transistor is associated with at least a first threshold voltage level Vt0 of a negative value corresponding to a first physical state or a second threshold voltage level Vt1 of a positive value corresponding to a second physical state. In the embodiment the first NAND flash transistor and the second NAND flash transistor respectively corresponding to the first physical state and the second physical state define a first CAM logic state "0" and the first NAND flash transistor and the second NAND flash transistor respectively corresponding to the second physical state and the first physical state define a second CAM logic state "1". The first word line and the second word line are respectively at either a ground voltage VSS=0V level or the complementary power voltage VDD level for performing a compare operation to determine if a single logic-bit match is found at either one of the first CAM logic state "0" or the second CAM logic state "1" when one of the first NAND flash transistor and the second NAND flash transistor is in non-conduction state.

In an alternative embodiment, the present invention provides a sector of M×N 2T-string NOR-based CAM logic cell array. The sector of M×N 2T-string NOR-based CAM logic cell array includes a M×N matrix of 2T-string NOR-based CAM logic cells including M paired horizontal word lines coupled through N vertical pages, where M and N are properly selected integer numbers. Each paired horizontal word lines includes a first word line and a second word line. Each of the N vertical pages includes M 2T-string NOR-based CAM logic cells connected in parallel sharing a vertical local bit line and a vertical local source line. The vertical local source line is accessed by a horizontal global source line via a first select transistor commonly for the N vertical pages and the vertical local bit line is accessed by a vertical global bit line via a second select transistor individually for each of the N vertical pages. Each of the M 2T-string NOR-based CAM logic cells includes a first NAND flash transistor connected a second NAND flash transistor in series. The first NAND flash transistor includes a first gate coupled to the first word line and a drain node coupled to the vertical local bit line. The second NAND flash transistor includes a second gate coupled to the second word line and a source node coupled to the vertical local source line. Each of the first NAND flash transistor and the second NAND flash transistor is associated with at least a first threshold voltage level Vt0 of a negative value corresponding to a first physical state or a second threshold voltage level Vt1 of a positive value corresponding to a second physical state. In the embodiment, the first NAND flash transistor and second NAND flash transistor respectively corresponding to the first physical state and the second physical state define a first CAM logic state "0" and the first NAND flash transistor and the second NAND transistor respectively corresponding to the second physical state and the first physical state define a second CAM logic state "1".

Additionally, the sector of M×N 2T-string NOR-based CAM logic cell array includes a search word device configured at least to generate M-bit logic outputs respectively coupled to the M paired horizontal word lines. Each pair of outputs is either at a ground voltage VSS=0V or at a complementary power voltage VDD level for initiating a compare operation to determine if a single logic-bit match is found for each of the M 2T-string NOR-based CAM logic cells at any one of the first CAM logic state "0" and the second CAM logic state "1" when one of the first NAND flash transistor and the second NAND flash transistor is in non-conduction state.

Furthermore, the sector of M×N 2T-string NOR-based CAM logic cell array includes a priority decoder device configured to receive N global bit lines respectively associated with the N vertical pages as N match lines for outputting match information to a hit line if at least one M-logic-bit match is found for one vertical page with all the M 2T-string NOR-based CAM logic cells respectively at either one of the first CAM logic state "0" or the second CAM logic state "1" and generating a priority list if multiple matches are found respectively for corresponding multiple vertical pages.

Moreover, the sector of M×N 2T-string NOR-based CAM logic cell array includes a Comparand address generator device coupled to the N match lines and received the match information from the N match lines and the hit line to generate an address list associated with one or more vertical pages having the at least one M-logic-bit match or one or more partial matches depending on the priority list.

Basically, the NOR-based BCAM and TCAM cell and array of the present invention is aimed to achieve not only faster Compare function over the rivaled NAND-based CAM cell but also faster over both SRAM-based BCAM/TCAM cell and the DRAM-based BCAM/TCAM cell due to less resistance used in the Comparator circuit by using one paired NAND cells storing two complementary Vt levels, for example, Vt0(−2.0V) and Vt1 (0.7V), set by Vt0<VSS<Vt1<VDD, to use the combinations of the two Vt levels to define two logic states of the CAM cell.

Furthermore, one advantage of the NOR-based CAM cell according to an embodiment of the present invention is that it can be flexibly changed between BCAM and TCAM using the same number of flash transistors in one preferred sector of M×N 2T-string CAM cell vertical page and cell array of multiple vertical pages without adding any extra transistors for area saving. It can be done by just adding a third "X" logic state to two logic states "1" and "0" for each BCAM cell. This "X" state can be easily done by assigning a higher positive Vt2, which is preferably set to be higher than Vt1 of 0.7V and VDD voltage, based by Vt0<VSS<Vt1<VDD<Vt2. If VDD is 1.5V or lower, then TCAM's Vt2 has to be greater than 1.5V at the end of product life cycle. The reason of this assignment is to ensure all MT and MB NAND cells in each CAM cell would not be turned on, thus input logic Vt1 and VSS levels are neglected in Compare operation.

In addition, when the basic 2T-string NOR-based CAM cell is extended in vertical direction while having each CAM cell connected in parallel to become a longer M 2T-string CAM cells in a vertical page, the further silicon area saving can be achieved by more than 50% at the expense with a slower match speed. The saving is due to the lower number of contacts being used in M 2T-string NOR-based CAM cell page layout.

Unlike the traditional SRAM-based CAM memory being configured into a horizontal page, the NOR-based CAM cell array of the present invention is preferably configured into one or more vertical pages with a flexible page length defined by the length of the input Comparand word or search key. In this invention, the page length is M logic bits.

The M×N NOR-based BCAM or TCAM cell array of this invention preferably uses the similar NAND's FN channel Program and Erase scheme to set up two preferred Vt levels, Vt0 and Vt1, for each BCAM cell and three preferred Vt levels, Vt0, Vt1 and Vt2, for each TCAM cell. The FN Program operation is preferably performed in a unit of a horizontal page as in WL direction with a length defined by the required density of CAM array. In an embodiment of the present invention, the length of a horizontal page is N bits. The FN Erase operation is preferably done in a unit of horizontal page as a page Program operation.

In this M×N NOR-based NMOS CAM cell array hierarchical routing according to an embodiment of the present invention, each locally divided vertical BL forms a first-level of match line, ML1, of each input Comparand word. The plurality of the vertical BLs is then routed to a plurality of NMOS pull-down devices to form a second-level of match line ML2 of second NOR-based CAM cell array in the same die.

As a result, a plurality of CAM cells can be cascaded on the same die for building the extremely high-density CAM cell array with a plurality of MLs in plurality of levels, in certain embodiments of the present invention. More flexibility, all parallel M-input fixed length of the N Comparand words can be flexibly configured into a serial unlimited length of Comparand words for a string of packet forwarding and classification data.

Many benefits can be achieved by applying the embodiments of the present invention. These and other benefits may be described throughout the present specification and more particularly below.

BRIEF DESCRIPTION OF THE DRAWINGS

FIG. 1B shows the definition of two logic states of "0" and "1", for a 6T1b DRAM-based BCAM cell shown in FIG. 1A in accordance with the prior art.

FIG. 2B shows the similar definition of two logic states of "0" and "1" for a 10T1b SRAM-based BCAM cell shown in FIG. 2A in accordance with the prior art.

FIG. 3B shows the definition of three logic states of "0", "1" and "X" for a 16T1b SRAM-based TCAM cell shown in FIG. 3A in accordance with the prior art.

FIG. 5D shows the definition of two logic states of "0" and "1" of a 2T-string NOR-based BCAM cell in accordance with the present invention. As opposed to the logic states defined by the prior art of VM-based BCAM or TCAM cells, the two Logic state, "0" and "1", are defined by two combinational values of MT's Vt and MB's Vt plus the two combinational voltage levels of WLM and WLMB.

FIG. 5E shows the definition of three or more logic states of "0", and "1" and "X" of a 2T-string NOR-based TCAM cell in accordance with the present invention. As opposed to the Logic states defined by prior art of VM-based BCAM or TCAM cells, all Logic states, "0" and "1" and "X" are defined by two combinational values of MT's Vt and MB's Vt plus the two combinational voltage levels of WLM and WLMB.

DETAILED DESCRIPTION OF THE INVENTION

In the following detailed description of the preferred embodiments, reference is made to the accompanying drawings, tables and flows that form a part hereof, and in which are shown by way of illustration specific preferred embodiments in which the inventions may be practiced. Basically, these embodiments will be described in sufficient detail to enable those skilled in the art to practice the invention, and it is to be understood that other embodiments may be utilized and that logical and electrical changes may be made without departing from the spirit and scope of the present invention.

The embodiments of the present invention cover one sector of non-volatile NOR-based BCAM and TCAM memory devices and arrays that comprises a plurality of 2T1b NAND cells. Both the Program and the Erase operations are substantially the same as the 2T2b NOR cell for Code storage in some patents granted to the same inventors and incorporated as references as indicated in the first section of this application.

Figure 1A:
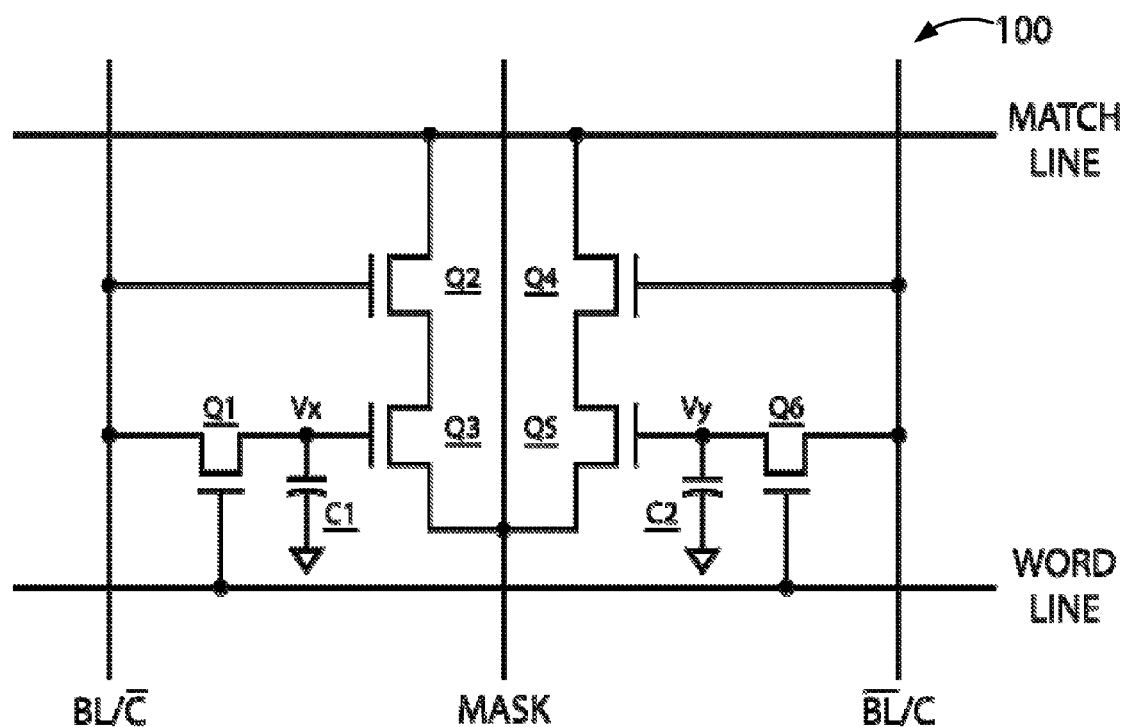
FIG. 1A shows a conventional 6T1b DRAM-based CAM cell circuit that comprises two conventional 1T1C DRAM cells along with one 4T Compare circuit. The DRAM cell comprises 1T NMOS transistor, Q1 or Q6, and one capacitor (1C), C1 or C2, connected in a series and a 4T Compare circuit comprises of 4 NMOS transistor of Q2, Q3, Q4 and Q5 with one MATCH line and MASK line in accordance with the prior art.
Figure 2A:
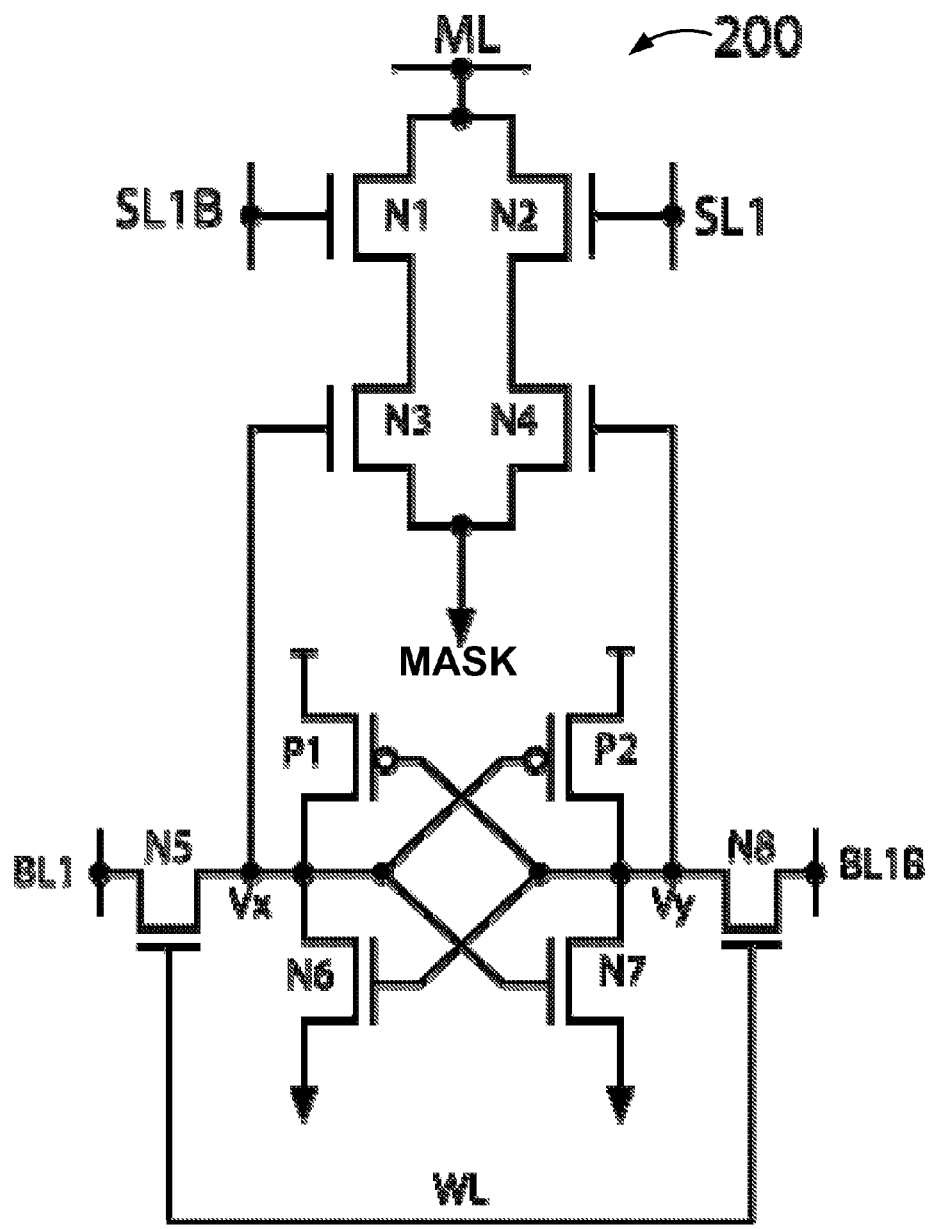
FIG. 2A shows a conventional 10T1b SRAM-based BCAM cell circuit that comprises one conventional 6T SRAM cell along with one similar 4T "Compare" circuit with one ML but no MASK line in accordance with the prior art.
Figure 3A:
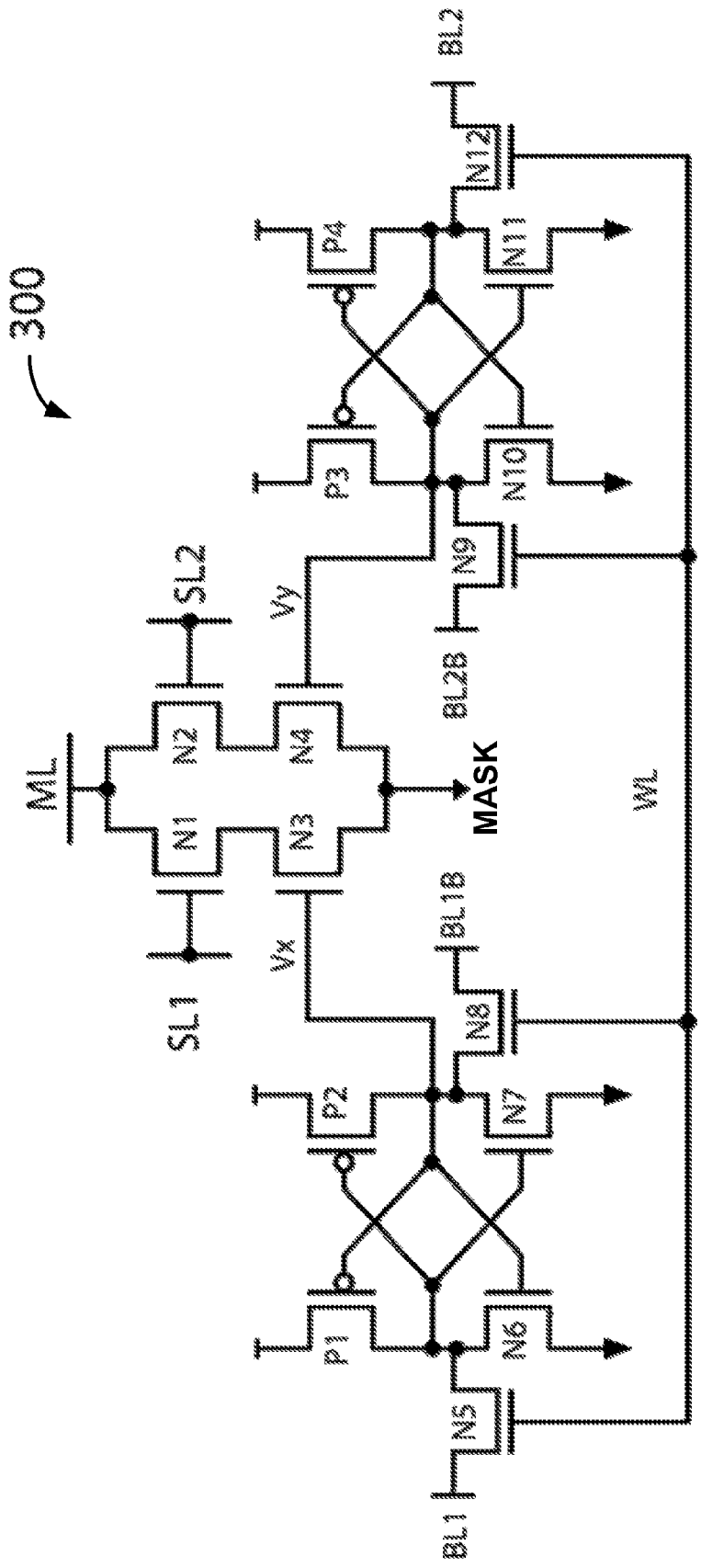
FIG. 3A shows another conventional 16T1b SRAM-based TCAM cell circuit that comprises two conventional 6T SRAM cells along with one similar 4T "Compare" circuit with one ML and zero MASK line in accordance with the prior art.

Unlike the typical the 6T1b DRAM-based BCAM cell shown in FIG. 1A and the 10T1b SRAM-based BCAM cell shown in FIG. 2A, and 16T1b SRAM-based TCAM cell shown in FIG. 3A, the NOR-based CAM cell of the present invention is a two-transistor-one-bit (2T1b) memory cell comprising two NAND transistors connected in series, regardless of 2-poly floating-gate-type or 1-poly SONOS-type NAND flash cell and process and regardless of whether it has PMOS flash or NMOS flash cell structure.

In addition, the 2MTMb NOR-based BCAM or TCAM cell of the present invention is basically built from the shortest NAND cell string length (i.e., 2T1b) to the longest NAND cell string length (i.e., 2MTMb), depending on the required CAM specification of matching speed and applications, where M is an integer greater than 1 (usually a number of factor 8).

Each basic 2T-string NOR-based CAM cell comprises two NMOS NAND flash cells (2T), MT and MB. Each NAND cell, MT or MB, can be either a 2-poly floating-gate or 1-poly charging gate NMOS or PMOS type.

Both MT and MB NAND flash cells are connected in series and are preferably stored with two complementary Vt levels such as Vt0 and Vt1, for BCAM and Vt0, Vt1 and Vt2 for TCAM cell. The Vt0 is a lower negative Vt level of −2.0V and the Vt1 is a small positive Vt level with a preferred value of 0.7V, which is set to be smaller than low VDD of 1.2V so that no need of a power-hungry boosted WL (>4.0V) voltage when this CAM memory is operating at VDD voltage as low as 1.2V.

In order to clearly disclose various embodiments of the present invention, several tradition CAM cell designs are presented first, which serves a purpose merely as part of an inventive process. FIG. 1A shows a detailed circuit schematic of a conventional 6T1b DRAM-based CAM cell 100 with one horizontal MATCH-Line and one vertical MASK-Line. It comprises two DRAM cells and one "Compare" circuit. Each DRAM cell comprises one NMOS select transistor (1T), Q1 or Q6, and one capacitor (1C), C1 and C2 with one complementary inputs of BL/CB and BLB/C. The BL and BLB are like the traditional BL/BLB inputs of each DRAM cell. The C and CB represent the paired inputs for each Compare circuit that comprises four NMOS transistors such as Q2, Q3, Q4 and Q5 with the MATCH Line (ML) on the common drain node of Q2 and Q4. The common source of Q3 and Q5 is defined as the MASK input.

When the 6T1b DRAM-based CAM cell is being selected for performing the Compare function, the MASK node would be coupled to VSS. Conversely, when the MASK node is coupled with VDD, the Selected 6T1b DRAM-based CAM is disabled and the ML would stay in the VDD level all the time without being discharged to VSS, regardless of the data stored in two DRAM cells at Vx and Vy nodes.

When performing matching function of this normal 6T1b DRAM-based CAM cell of prior art, the corresponding MASK node is coupled to VSS. If the Comparand bit data to BL/CB and BLB/C matches the DRAM stored data C1 and C2 respectively, then one of string of Q2/Q3 or Q4/Q5 would conduct the current from ML to the MASK node. Prior to the normal Compare function, the ML was pre-charged to VDD in one cycle. Now, once the data of each Comparand bit matches the stored data in each DRAM bit, the ML would be pulled to low to signal a MATCH is found in this DRAM-based CAM memory.

FIG. 1B shows two logic states of each 6T1b DRAM-based BCAM cell of FIG. 1A. Again, presenting the logic states of this traditional DRAM-based BCAM cell is merely used as part of an inventive process as described below. As like each traditional SRAM cell has a paired storage nodes of Q and QB, two DRAM-cells provide the similar paired Q and QB of each DRAM-based CAM cell. As shown, the logic state '0' corresponds to node Vx at 0 V and node Vy at VDD level and the logic state '1' corresponds to node Vx at VDD level while node Vy at 0V.

One disadvantage of the 6T1b DRAM-based CAM cell 100 is that it requires frequent refreshing cycles to ensure the charges are not lost in both capacitors during read and Compare operations.

FIG. 2A shows a detailed circuit schematic of a conventional SRAM-based 10T BCAM cell 200 with one similar horizontal MATCH-Line and one MASK-Line. It comprises one 6T SRAM cell and one 4T "Compare" circuit. Again, presenting this traditional SRAM-based 10T BCAM cell diagram is merely used as part of an inventive process as described below.

The 6T SRAM cell comprises four NMOS transistors (4T), N5, N6, N7 and N8, and two PMOS transistors (2T), P1 and P2, with one pair of complementary inputs of BL1 and BL1B.

The Compare circuit comprises 4T NMOS transistors such as N1, N2, N3 and N4 with one paired gate inputs of SL and SLB along with one common node of the horizontal ML on both drain nodes of two top NMOS transistors, N1 and N2. Similarly, the bottom common source node of two NMOS devices, N3 and N4, is coupled to the MASK node as above DRAM-based CAM cell.

When performing matching function of this normal 10T1b SRAM-based CAM cell of prior art, the corresponding MASK node is coupled to VSS. If the Comparand bit data at SL1 and SL1B matches the SRAM stored data of Vy and Vx respectively, then at least one of the two strings of N1/N2 and N3/N4 would conduct the current from ML node to MASK node. Prior to the normal Compare function, the ML node was similarly pre-charged to VDD in one cycle. Now, once the data of each Comparand bit matches the stored data in each SRAM bit, the ML would be pulled to low to signal a MATCH found in this SRAM-based CAM memory.

FIG. 2B shows two logic states of each 10T1b SRAM-based BCAM cell 200. Again, presenting the logic states of this traditional SRAM-based BCAM cell is merely used as part of an inventive process as described below. Each SRAM cell has a paired storage nodes at Vx and Vy. The combination of the complementary voltage of Vx and Vy makes two logic states as 6T1b DRAM-based CAM cell 100 shown in FIG. 1A. For example, the Logic "1" state means Vx=VDD along with Vy=VSS, but Logic "0" state means Vx=VSS with Vy=VDD.

One advantage of this 10T1b SRAM-based BCAM cell 200 over the 6T1b DRAM-based BCAM cell 100 is that it does not require frequent refreshing cycles to sustain its stored data. But there are two disadvantages of the 10T1b SRAM-based CAM cell 200. One is its large cell size and the other is the volatile storage nature like the 6T1b DRAM-based CAM cell 100. Once the VDD power is removed, this 10T1b SRAM-based BCAM cell data cannot be retained. The 10T1b SRAM-based BCAM cell has to be reloaded again whenever VDD power is turned on.

FIG. 3A shows another conventional 16T1b SRAM-based TCAM cell circuit 300 that comprises two conventional 6T SRAM cells along with one similar 4T "Compare" circuit with one ML and zero MASK line. Again, presenting this traditional SRAM-based TCAM cell diagram is merely used as part of an inventive process as described below.

Two 6T SRAM cells are respectively configured in a same SRAM structure shown in FIG. 2A. A first SRAM cell comprises four NMOS transistors (4T), N5, N6, N7 and N8, and two PMOS transistors (2T), P1 and P2, with one pair of complementary inputs of BL1 and BL1B. A second SRAM cell comprises four NMOS transistors, N9, N10, N11 and N12, and two PMOS transistors (2T), P3 and P4, with one pair of complementary inputs of BL2 and BL2B. Two access NMOS transistors N5/N8 of the first SRAM cell and N9/N12 of the second SRAM cell are commonly linked to a word line WL. Similarly, the Compare circuit comprises 4T NMOS transistors such as N1, N2, N3 and N4 with one paired gate inputs of SL1 and SL2 along with one common node of the horizontal ML on both drain nodes of two top NMOS transistors, N1 and N2. Similarly, the bottom common source node of two NMOS devices, N3 and N4, is coupled to the MASK node.

When performing matching function of this 16T1b SRAM-based TCAM cell, the corresponding MASK node is coupled to VSS. Each SRAM cell contributes one data node to couple with the Compare circuit. For example, the first SRAM cell has a data node Vx linked to N3 and the second SRAM cell has another data node Vy linked to N4. If the Comparand bit data at SL1 and SL2 respectively matches the data of Vx and Vy stored in the paired SRAM cells as configured above (FIG. 3A), then at least one of the two strings of N1/N3 and N2/N4 would conduct the current from ML node to MASK node. Prior to the normal Compare function, the ML node was similarly pre-charged to VDD in one cycle. Now, once the data of each Comparand bit matches the stored data in each SRAM bit, the ML would be pulled to low to signal a MATCH found in this SRAM-based CAM memory.

FIG. 3B shows three logic states of each 16T1b SRAM-based TCAM cell 300. Again, presenting the logic states of this traditional SRAM-based TCAM cell is merely used as part of an inventive process as described below. Each of the two SRAM cells has one storage node, either Vx and Vy, connecting to control gate of N3 and N4. The combination of the complementary voltage of Vx and Vy makes three logic states when the two SRAM cells are configured into the TCAM cell structure shown in FIG. 3A. For example, the Logic "0" state means Vx=VSS along with Vy=VDD, Logic "1" state means Vx=VDD with Vy=VSS, and Logic "X" state means Vx=VSS with Vy=VSS. The main disadvantages of the 16T1b SRAM-based TCAM cell 300 also include the large cell size and its volatile storage nature like the 6T1b DRAM-based CAM cell 100. Once the VDD power is removed, this 16T1b SRAM-based TCAM cell data cannot be retained.

Figure 4A:
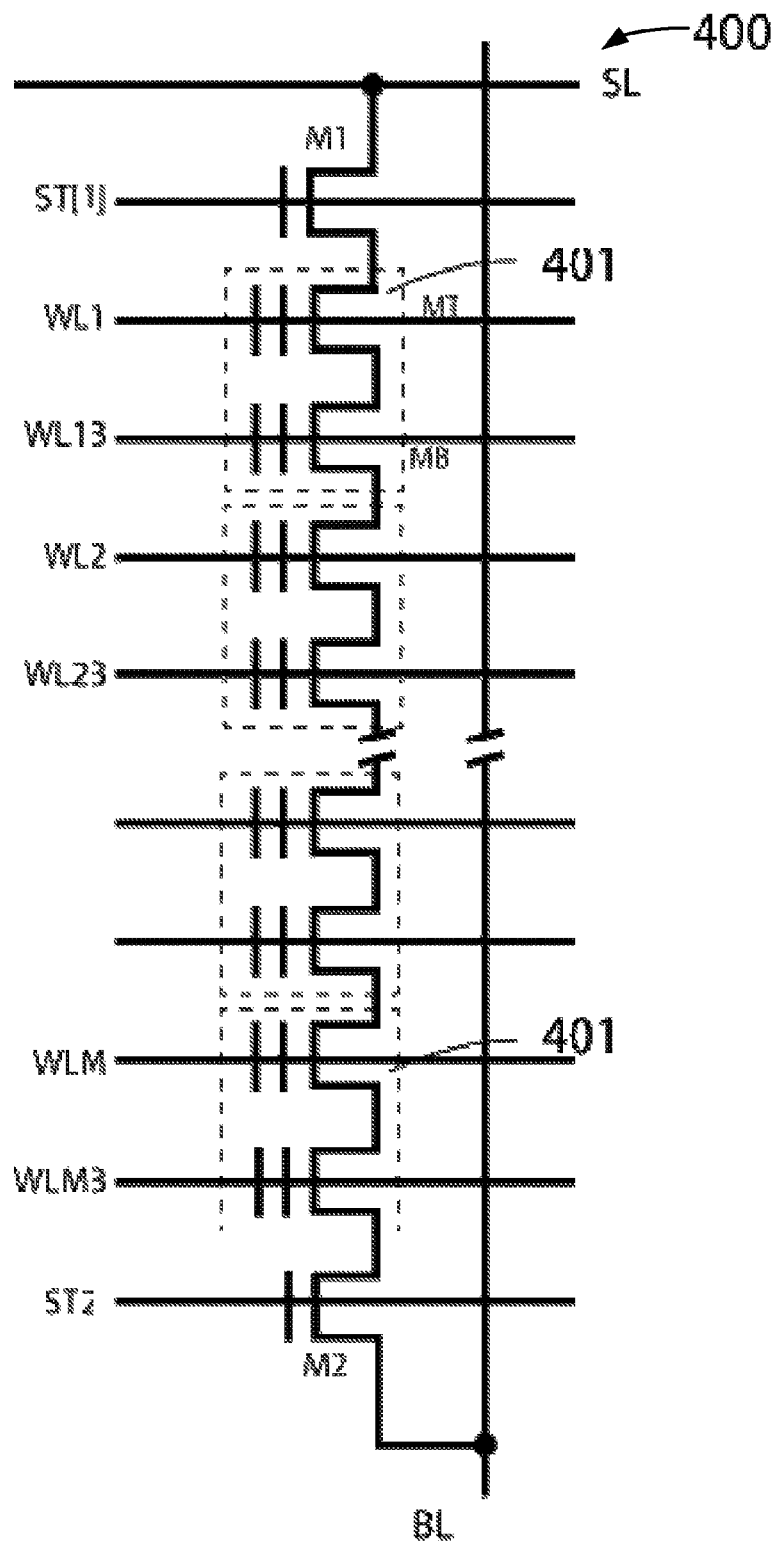
FIG. 4A shows a conventional NMOS 2MTMb NAND-based BCAM cell string circuit that comprises M-paired 2-poly cells all connected in series sandwiched by two 1-poly Select transistors, M1 and M2, and one horizontal SL connected to the top node and one vertical BL connected to the bottom node. Each vertical string of the 2MTMb NAND-based CAM contains M "Compare" bits, MT and MB, with M-paired gates tied to the corresponding paired WLs, WLM and WLMB, in accordance with the prior art. Note, MT stands for Top NAND cell, while MB stands for Bottom NAND cell of a paired NAND cell.

FIG. 4A shows a conventional NMOS 2MTMb NAND-based BCAM cell string circuit according to a prior art (U.S. Pat. No. 8,169,808). Presenting this traditional NAND-based BCAM cell string diagram is merely used as part of an inventive process as described below. As shown, the 2MTMb NAND-based BCAM cell string circuit 400 comprises M-paired 2-poly NAND transistor cells 401 sandwiched by two 1-poly Select transistors, M1 and M2, and one horizontal SL connected to the top source node and one vertical BL connected to the bottom drain node. Each vertical string of the 2MTMb NAND-based CAM contains M "Compare" bits, MT and MB, with M-paired gates tied to the corresponding paired WLs, WLM and WLMB, as shown in FIG. 4A. Note, MT stands for Top NAND cell, while MB stands for Bottom NAND cell of a paired NAND cell.

Figure 4B:
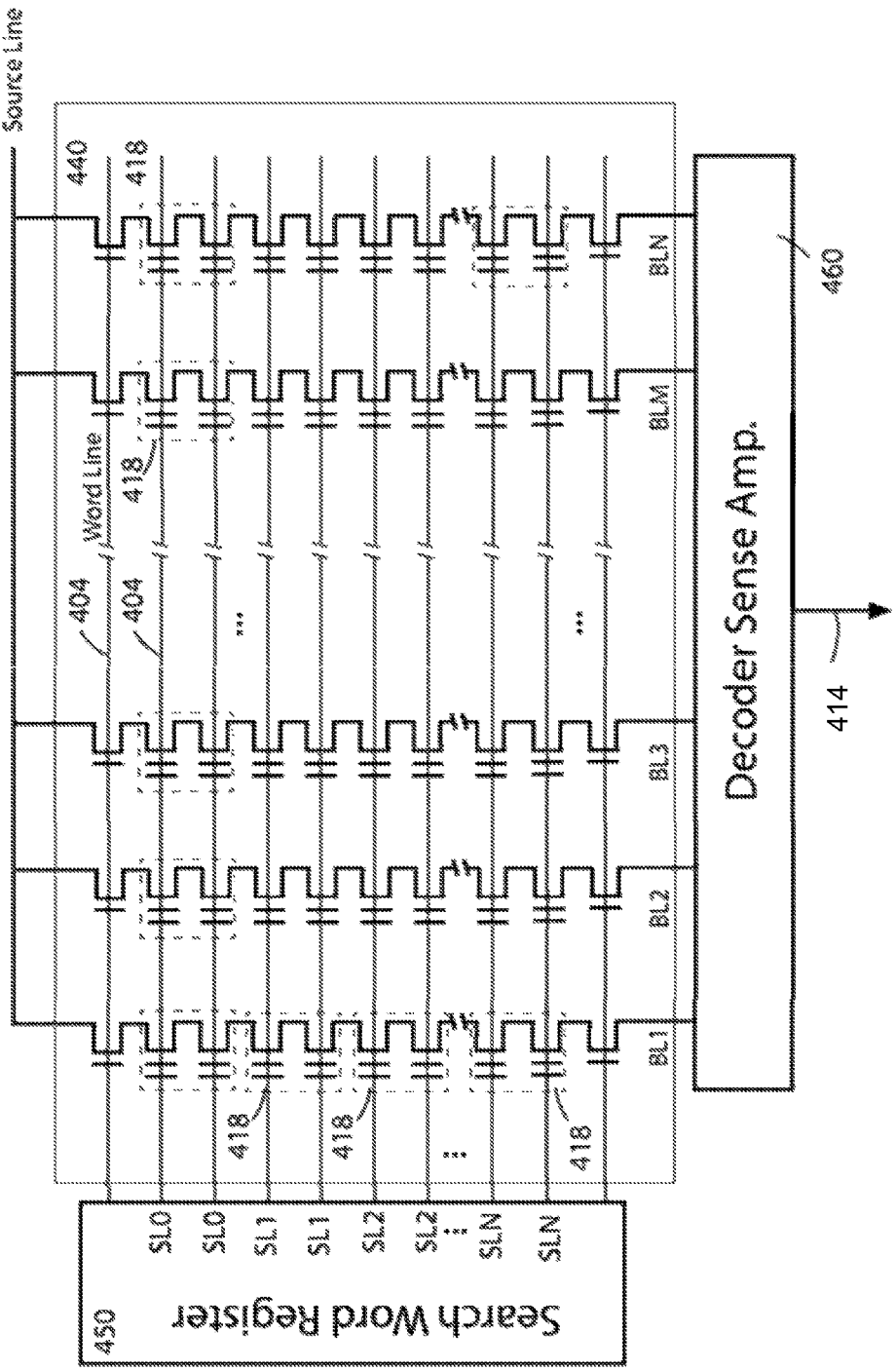
FIG. 4B shows one sector of NMOS 2MTMb NAND-based MT BCAM cell array circuit of a prior art. The BCAM sector comprises three major parts such as CAM sector array, Search Word Register and Decoder Sense Amp., along with one Source line, SL, and Hit line, HL.

FIG. 4B shows a conventional sector of 2MTMb NAND-based BCAM cell array circuit according to the same prior art mentioned above. Again, presenting this traditional NAND-based BCAM cell array diagram is merely used as part of an inventive process as described below. As shown, the 2MTMb NAND-based BCAM cell array 440 a sector of 2M rows and N columns of NMOS transistors configured with each paired NAND bits, 418, being a vertical paired NAND cells with one paired search lines (e.g., SL1 and SL1B, outputting to corresponding wordlines 404) but one bitline (e.g., BL1) corresponding to the paired 2-poly NAND transistor cells 401 shown in FIG. 4A. The BCAM memory array matrix is being reorganized into 2M WLs×N BLs with total 2M×N bits as oppose the matrix organization of M WLs×2N BLs in another conventional horizontally configured NAND-based CAM sector of the same prior art (U.S. Pat. No. 8,169,808). In one sector of the BCAM array 440, there are total N pages. Each page of BCAM memory is defined as one vertical column of the sector 440 for storing M-bit Comparand bits for data search, driven by one BL from a Decoder Sense Amp circuit 460 located in bottom of the BCAM sector. A Search Word Register, 450, located on left of the cell array 440 providing M-bit with 2M outputs of SL1/SL1B to SLM/SLMB connected to all N pages, each being associated with a BL from BL1 through BLN.

The number of NAND transistors in one string is doubled to take the number of input lines increased from M WLs (for the horizontally configured NAND-based BACM cell array) to M-paired WLs, which is 2M WLs. The paired gates of each vertical paired of NAND flash cells, 418, are connected to one paired WLs. Each paired NAND cells in same string store two fully complementary Vt0 and Vt1. But "Address Control" for M-WL inputs is replaced by the Search Word Register 450 for providing M-WL paired inputs. 2N BLs are halved to be N BLs only. Thus, this vertically configured NAND-based BCAM cell array of FIG. 4A has some advantages over the horizontally configured NAND-based CAM cell array. For example, the horizontally configured NAND-based BACM cell array cannot perform the simultaneous Compare function on whole M pages of one CAM sector. While for the vertically configured NAND-based BACM cell array 440, the whole sector of 2M×N bits or N vertical pages can be compared against the vertical page of Operarand word within one cycle. In other words, this is M times faster for matching function. The cells in each string of the CAM array are selected for performing the Compare function. No so-called pass-transistor in each NAND string is needed.

However, there are still some disadvantages associated with this conventional NAND-based BCAM cell array. The main disadvantages include: a) Only ML is generated by Decoder Sense Amp 460 for whole N vertical pages in one 2M×N sector because the plurality of the SL nodes of the plurality of N strings are commonly grouped through a plurality of NMOS devices to encode a match/not-match indication to the ML 414. b) When one or more matches of one Operand word are found, there is no way to tell which NAND string page matches the Operand word page. c) The NAND-based BCAM cell array still has very large string resistance for discharging ML pre-charged VDD voltage which is even doubled when changing from the horizontal configuration to the vertical configuration (FIG. 4B). The Compare function speed is very slow. Typically, the ML speed more than 20 μs if a 32T NAND-cell string is used (In this case, M=16).

Figure 5A:
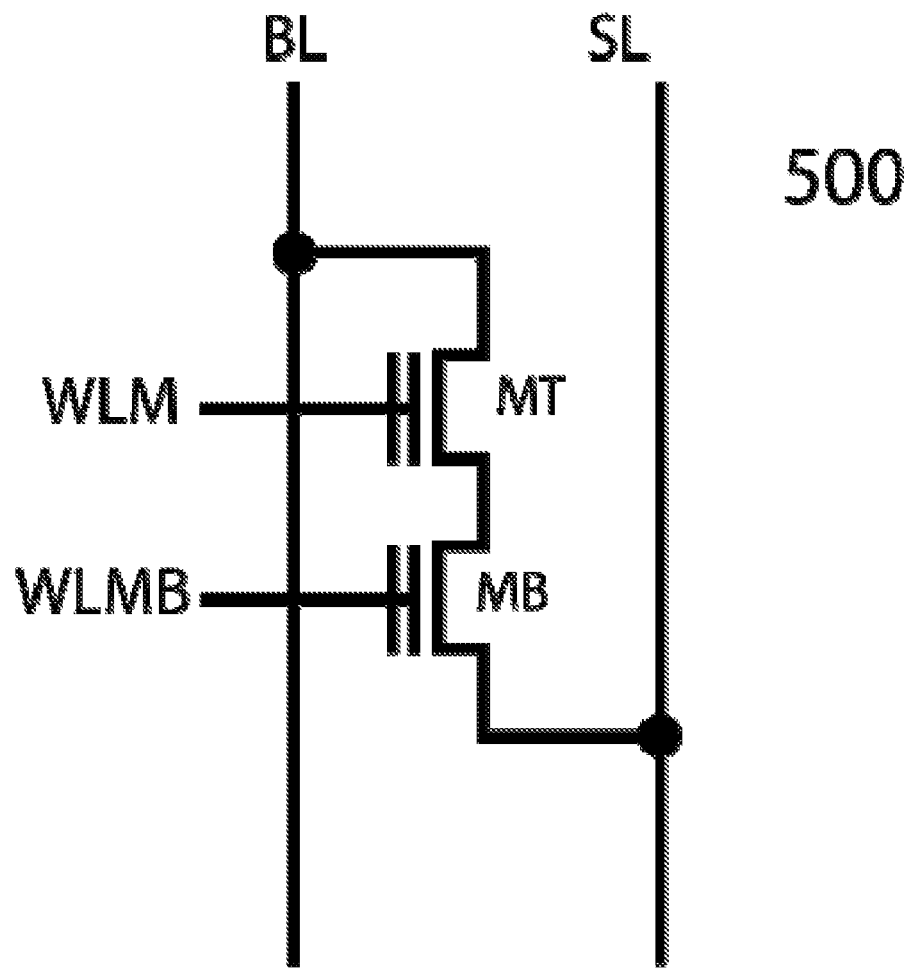
FIG. 5A shows a 2T-string NOR-based CAM logic cell circuit according to an embodiment of the present invention. The CAM cell comprises two similar NAND cells, MT and MB, connected in series with a BL connected to the top node and a SL connected to the bottom node, both running in y-direction without an overhead of a Latch circuit for performing the "Compare" function in accordance with the present invention.

FIG. 5A shows a 2T-string NOR-based CAM cell circuit according to an embodiment of the present invention. This diagram is merely an example, which should not unduly limit the scope of the claims herein. One of ordinary skill in the art would recognize other variations, modifications, and alternatives. As shown, the CAM cell 500 comprises two physical NAND flash transistors, MT and MB, connected in series with a BL connected to the top node and a SL connected to the bottom node, both running in parallel in y-direction without an overhead of a Latch circuit for performing the "Compare" function in accordance with the present invention. This vertically configured one CAM cell 500 comprises two physical NAND flash transistors being connected in series with one complementary pair of WLs, WLM and WLMB, and one vertical BL connected on top node in parallel with one SL line connected to the bottom node. The two NAND transistors are made within the same triple P-well within the same deep N-well on top of the common P-substrate as a regular 2-poly NAND flash process in mass production. Physically, the two NAND flash transistors corresponds to two physical memory cells and each NAND cell can be in erased state or one or more programmed states and can be combined to provide definition of a logic state for the 2T-string CAM cell depending on the respective physical states of each NAND cell.

Figure 5B:
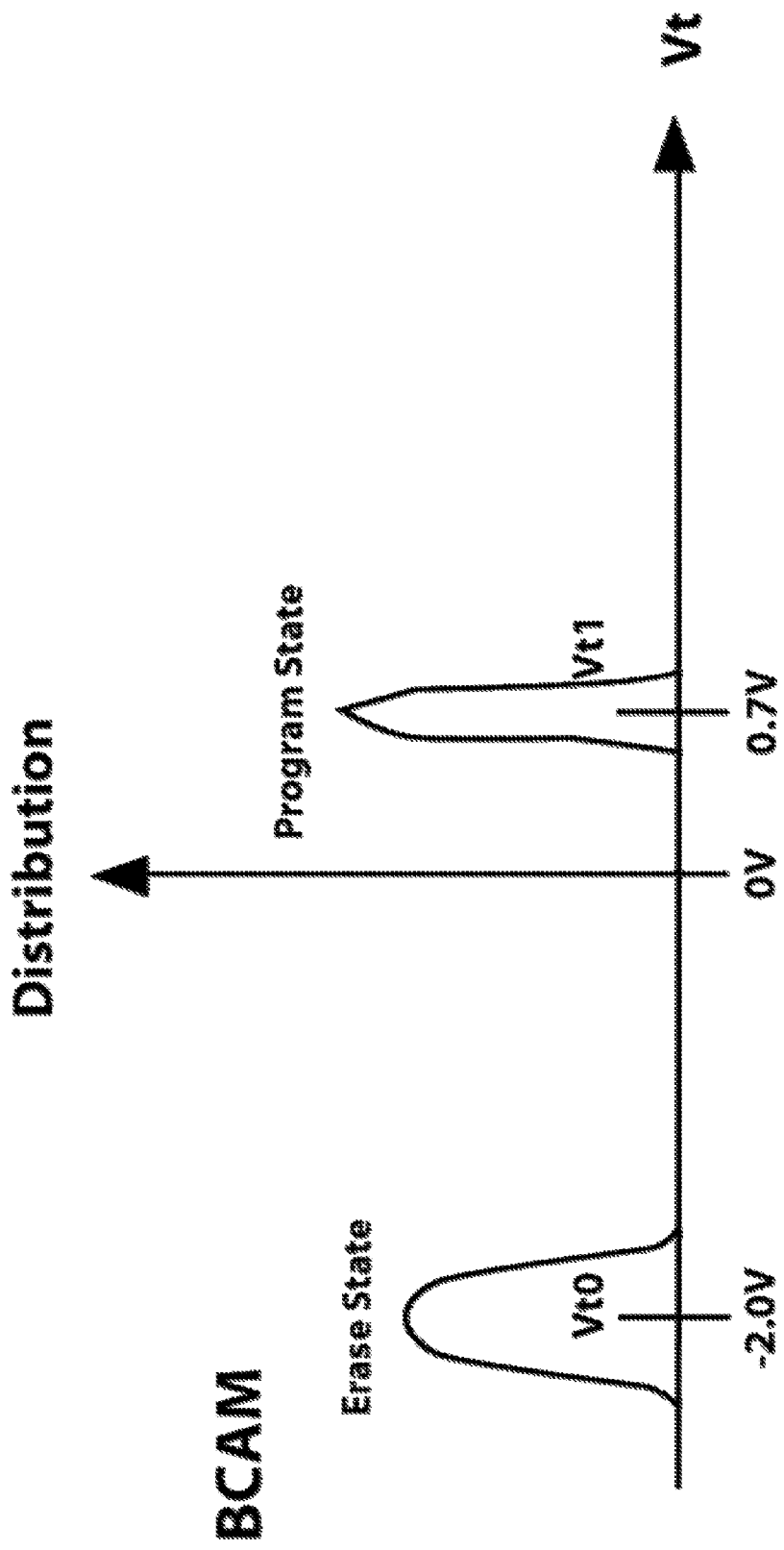
FIG. 5B shows two preferably defined Vt distributions, Vt0 of −2.0V and Vt1 of 0.7V, of each 2T-string NOR-based BCAM cell for defining two logic states for the CAM cell in accordance with the present invention.

FIG. 5B shows two preferred threshold voltage Vt distributions of Vt0 and Vt1 of the 2T-string NOR-based BCAM cell 500 of FIG. 5A in accordance with the present invention. This diagram is merely an example, which should not unduly limit the scope of the claims herein. One of ordinary skill in the art would recognize other variations, modifications, and alternatives. The Vt0 is an erased state in a wide Vt distribution with a center value of a negative value (<VSS the ground voltage level), e.g., −2.0V, while the Vt1 is a programmed state in a narrower Vt distribution with a preferred center positive value, e.g., 0.7V, but smaller than VDD power level, under the bit-by-bit program and verify operations as popularly done in the MLC NAND program. A typical rule of thumb for setting the Vt states for the 2T-string NOR-based BCAM is: Vt0<VSS<Vt1<VDD, with proper sensing margin.

Figure 5C:
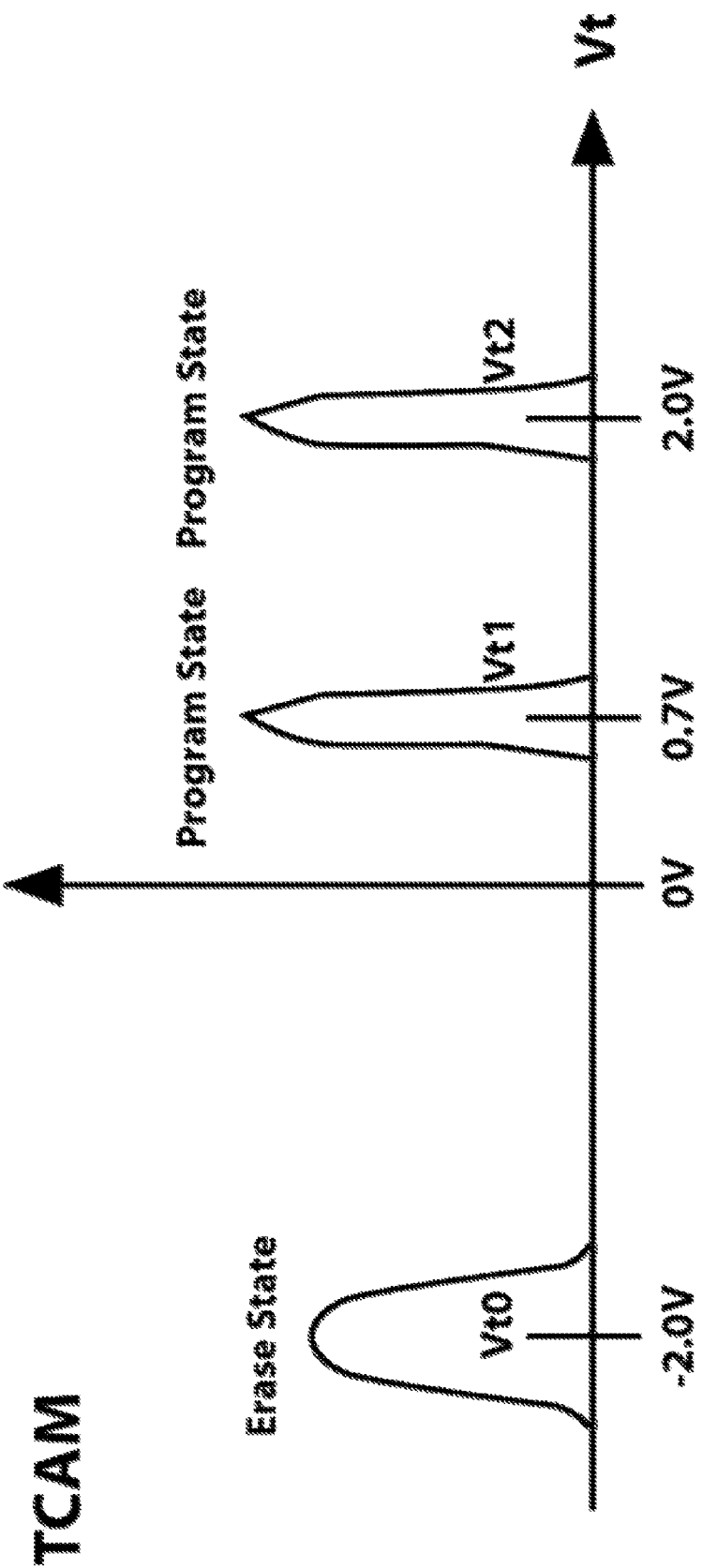
FIG. 5C shows three preferably defined Vt distributions, Vt0 of −2.0V and Vt1 of 0.7V and Vt2 of +2.0V (greater than VDD), of each 2T-string NOR-based TCAM cell for defining three logic states for the CAM cell in accordance with the present invention.

FIG. 5C shows three preferred Vt distributions of Vt0, Vt1 and Vt2 of the 2T-string NOR-based TCAM cell 500 of FIG. 5A in accordance with the present invention. This diagram is merely an example, which should not unduly limit the scope of the claims herein. One of ordinary skill in the art would recognize other variations, modifications, and alternatives. The Vt0 is also an erased state with a wide Vt distribution having a center negative value (for example, −2.0V), while the Vt1 and Vt2 are the positive programmed states with a narrower Vt distribution, having a preferred center value of 0.7V and +2.0V, respectively under the bit-by-bit program and verify operations as popularly done in the MLC NAND program. A typical rule of thumb for setting the Vt states for the 2T-string NOR-based TCAM is: Vt0<VSS<Vt1<VDD<Vt2, with proper sensing margin.

FIG. 5D shows the preferred definition of two preferred logic states of "0" and "1" of the 2T-string NOR-based BCAM cell 500 of FIG. 5A in accordance with the present invention. This diagram is merely an example, which should not unduly limit the scope of the claims herein. One of ordinary skill in the art would recognize other variations, modifications, and alternatives. The operations of logic match and not-match are explained detail by the preferred combination of on/off states of MT and MB based on corresponding Vt assignments. Specifically, for a logic state of "0" associated with a state having the top NAND transistor MT at Vt0 level (=–2.0V) and bottom NAND transistor MB at the Vt1 level (=0.7V) for a 2T-string NOR-based BCAM cell. When the search word line sends data inputs WLM at VSS (=0V) and WLMB at VDD (=1.2V) corresponding to gates of MT and MB at the above logic states, it defines a "NO" result as for the BCAM cell's Compare function, i.e., a no-match is found. When the search word line sends data inputs WLM at VDD and WLMB at VSS corresponding to gates of MT and MB at the above logic states, it defines a "YES" result as for the BCAM cell's logic Compare function, i.e., there is a single logic-bit match. Conversely, for a logic state of "1", the MT, MB's Vt level is reversed and the condition for the logic match/no-match of BCAM cell Compare operation is also reversed. A typical rule of thumb for setting the Vt states for the 2T-string NOR-based BCAM is: Vt0<VSS<Vt1<VDD, with proper sensing margin.

FIG. 5E shows the preferred definition of three or more preferred logic states of "0", "1" and "don't care" states: "X1" and "X2" (or simply "X" state) of the 2T-string NOR-based TCAM cell 500 of FIG. 5A in accordance of the present invention. This diagram is merely an example, which should not unduly limit the scope of the claims herein. One of ordinary skill in the art would recognize other variations, modifications, and alternatives. All logic states, "0" and "1" and "X" are defined by two combinational values of MT's Vt and MB's Vt which can be compared with input (logic) data via the two voltage levels of WLM and WLMB in complementary assignment. The operations of the logic match and not-match are explained in detail by the preferred combination of on/off states of MT and MB based on corresponding Vt assignments. Specifically, a CAM logic state of "0" is associated with a configuration wherein the top NAND transistor MT is at a negative value of Vt0 (for example, –2.0V) level and bottom NAND transistor MB is at the positive value of Vt1 (for example, 0.7V) level for a 2T-string NOR-based BCAM cell. When the search word line sends data inputs WLM at VSS=0V and WLMB at VDD (greater than Vt1, for example, 1.2V) corresponding to the gates of MT and MB at the above logic state "0", it defines a "NO" result as for the TCAM cell's Compare function, i.e., no match. When the search word line sends data inputs WLM at VDD and WLMB at VSS corresponding to the gates of MT and MB at the above logic state "0", it defines a "YES" result as for the TCAM cell's Compare function, i.e., there is a single logic-bit match. Conversely, for a logic state of "1", the MT, MB's Vt level is reversed and the condition for logic match/no-match of the TCAM cell Compare operation is also reversed. Additionally, when the logic state is in "X1" with corresponding MT at a higher positive threshold voltage level Vt2 (greater than VDD, for example, +2.0V) the MB's threshold voltage level can be either at Vt0 or Vt1, making the MB at a kind of "don't care" physical state because the TCAM cell will always be in an 'off' state since the MT is always in "off" state with WLM at either VSS or VDD no matter what the MB's Vt is in any level with WLMB at either VSS or VDD. The logic match is determined to be "don't care" as an output of the compare operation. Similarly, when the logic state is in "X2" with corresponding MB at the Vt2=+2.0V, the MT's Vt can be either at Vi0 or Vt1 and the TCAM cell will again always be in an 'off' state without yielding the strictly defined logic match or no-match for Compare operation no matter what the corresponding word line signals WLM and WLMB are sent respectively to the gates of MT and MB. In an embodiment, there is no need to distinguish "X1" or "X2" state, for the overall effect being represented by a non-conducting CAM cell no matter what the Comparand word lines voltage setting (provided the WLM and WLMB are set as VSS/VDD complementarily). A typical rule of thumb for setting the Vt states for the 2T-string NOR-based BCAM is: Vt0<VSS<Vt1<VDD, with proper sensing margin.

Figure 5F:
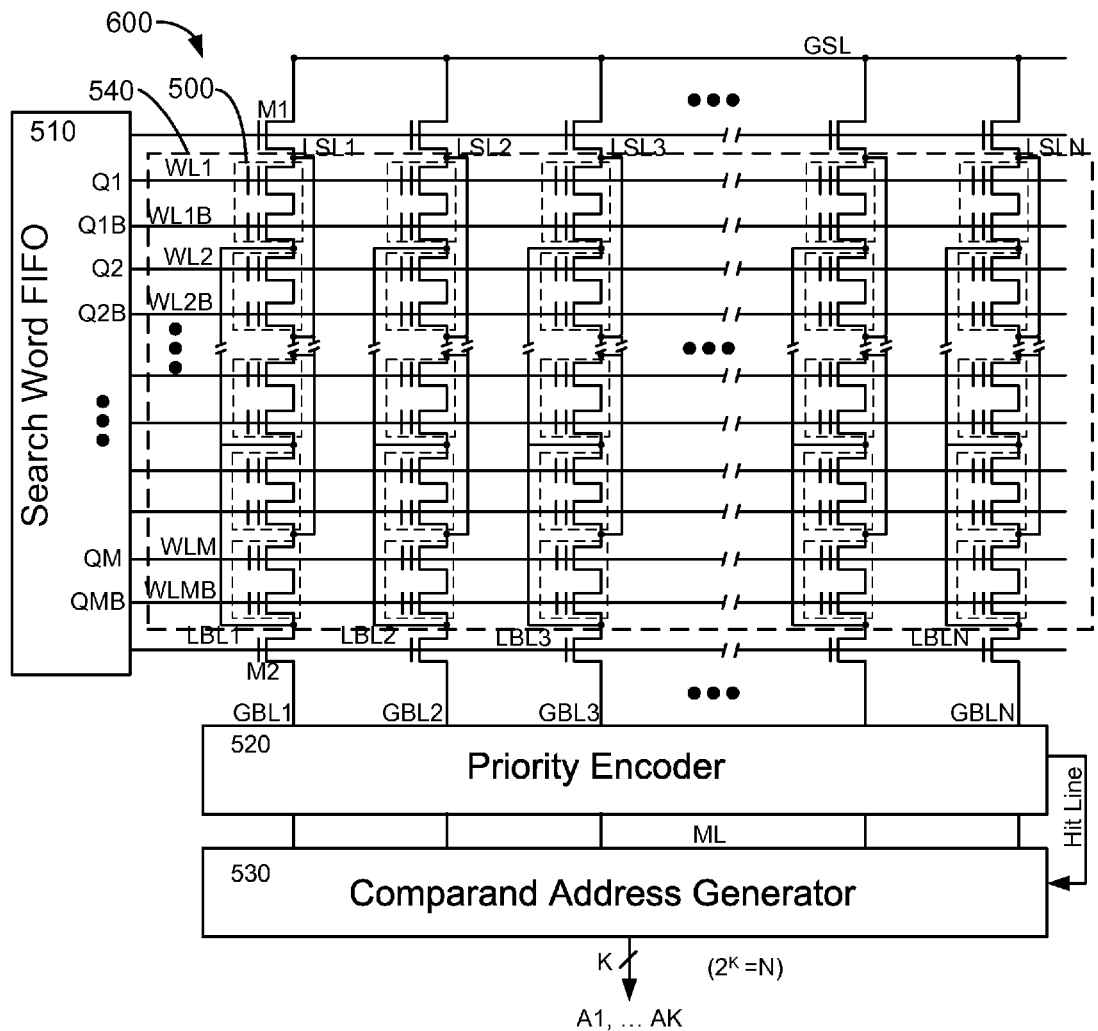
FIG. 5F shows one sector of M×N 2T-string NOR-based HCAM logic cell array in accordance with the present invention.

FIG. 5F shows a detailed circuit schematic of one sector of the preferred 2T-string NOR-based BCAM and TCAM cell array according to an embodiment of the present invention. This diagram is merely an example, which should not unduly limit the scope of the claims herein. One of ordinary skill in the art would recognize other variations, modifications, and alternatives. As shown, the sector 600 of M×N 2T-string NOR-based BCAM or TCAM logic cell array includes five major circuit parts. The first part is the CAM array 540 organized in a matrix of M×N 2T-string NOR-based CAM logic cells with 2M horizontal rows of word lines (WLs) and N vertical strings (with respective vertical global bit lines GBLs). Each vertical string, corresponding to a vertical page of the sector, includes M 2T-string NOR-based CAM logic cells connected in parallel sharing a vertical local bit line LBL and a vertical local source line LSL capped by two 1-poly Select transistors M1 and M2. Each 2T-string NOR-based CAM logic cell is substantially the same as that described in FIG. 5A, made by a first NAND flash transistor and a second NAND flash transistor connected in series. Each vertical local bit line is accessed via the Select transistor M2 from the vertical global bit line GBL and each vertical local source line is accessed via the Select transistor M1 from a horizontal global source line GSL. The sector 600 of M 2T-string NOR-based CAM cell array is equivalent to total 2M×N physical bits of NAND cells. Totally, there are N GBLs and N LSLs for the CAM array 540, and M paired horizontal WLs, one horizontal GSL, N vertical pages for the sector 600.

The second part is the Search Word FIFO Register, 510, located on left side of the CAM array 540. The present invention provides M paired WLs and two ST lines for operating the NOR-based CAM array 540. A vertical page, in this invention, is associated with an M-bit vertical Comparand Word page based on each vertical string of M 2T-string NOR-based CAM logic cells.

The third part is the Priority Encoder, 520, with a plurality of ML inputs connected to N GBLs and one Hit line (or a global match line). This part is something like the circuit of Decoder/Sense Amp of the conventional NAND-based CAM and VM-based CAM.

All the MLs are grouped as a plurality inputs to a Comparand Address Generator, 530, to extract the identified one or more M-bit Addresses, A1, A2, . . . , up to AK, having at least words in the CAM sector partially matched to the last Comparand word from the Search Word FIFO Register 510. Herein, K is an integer related with the number of CAM cell strings N in following way: $N=2^K$.

There are several advantages of this 2T-string NOR-based CAM cell array of the present invention over all the conventional CAM cells mentioned in earlier sections of the Detailed Description of the Invention. These advantages are summarized as: a) A much improved operation speed is provided for the "Compare" function of the 2T-string NOR-based CAM logic cell design. It takes less than 50 ns for the two physical NAND cells to discharge each SL with the initial pre-charged VDD voltage to a low detecting voltage. This is about 400 times improvement over conventional NAND-based CAM operation. b) This NOR-based CAM still has comparable cell scalability like NAND cell. Thus, it can be scaled down to 20 nm without problem. c) When each NAND cell stored two Vt states such as Vt0=−2.0V and Vt1=+0.7V, then it works as a NOR-based BCAM for VDD operation (as low as 1.2V). d) When each NAND cell stored three Vt states such as Vt0=−2.0V and Vt1=+0.7V and Vt2>1.5V, then it works as a NOR-based TCAM for VDD operation with a fast Compare speed without a boosted WL.

Now, the detailed operation of this 2T-string NOR-based CAM cell array of the present invention will be explained below. The following explanations are with reference to the drawings of FIGS. 5A-5E of the present inventions.

From the cell architectural design point of view, when it comes to the decision-making for a NOR flash cell and array design, then there are many cell structures available for choice, depending on the required applications, scalability, density and read and write performance in specification. When it comes to the decision-making for a NOR-based CAM logic cell and array design in MOS process, then the available cell structures for choice are much less due to the specification requiring low-cost, low-current, faster "Compare" operation as well as an extremely high memory density.

In regards to density consideration, the highest density for state-of-arts standalone SRAM cell in production is around 256 Mb for low-voltage (LV) logic node at 28 nm due to big SRAM cell size. The highest DRAM density achieved so far is around 4 Gb at 32 nm logic node. But the highest density for the standard EPROM Tunnel Oxide (ETOX)-based NOR product is only 1 Gb available in production at 45 nm logic node. For other kinds of split-gate flash cell structures, the highest density achieved is less than 64 Mb at 65 nm node only. In conclusion, only the highly scalable NAND flash cell technology achieves the density of 256 Gb SLC per chip at 20 nm node. Even the NAND flash technology requires much higher voltage level of about 20V for both Program and Erase operation, but its unique cell structure has been proven the best scalability and lowest bit cost.

Therefore, this 2T-string NOR-based CAM logic cell design using a paired NAND cell structure (FIG. 5A) can follow the Moore's law like typical NAND configuration to achieve much higher density down to 20 nm node than any other NOR-based CAM at a lower cost.

For a SLC NAND flash cell, the cell size is $4\lambda^2$. For the conventional NAND-based CAM cell scheme, the CAM cell size is increased to $8\lambda^2$ because each CAM cell uses one pair of NAND cells connected in series without a Contact node between each CAM cell in the whole NAND string.

For this 2T-string NOR-based CAM cell of the present invention, its structure still uses two NAND cells connected in series. But when the 2T-string NOR-based CAM cell is used for forming part of a vertical page with other 2T-string NOR-based CAM cell, the neighboring CAM cells are connected in parallel to share corresponding vertical LBL and LSL, as shown in FIG. 5F. This requires one contact at each corresponding LBL and LSL node, thus making the CAM unit cell size larger than just a pair of conventional NAND cells connected in series. For SLC 2T-string NOR-based CAM cell, the cell size would be about $12\lambda^2$. As a result, one trade-off for fast readout speed it that this NOR-based CAM cell design potentially achieves just ⅓ memory density of the conventional SLC NAND CAM. Therefore, the highest density of the 2T-string NOR-based CAM cell can achieve larger than 64 Gb at 20 nm node.

Referring to FIG. 5B and FIG. 5D, in another embodiment, the Compare function performance of 2T-string NOR-based BCAM cell is illustrated. Since the BCAM cell design is the low-cost and low-power one, no boosted WL is used for the Compare function. In contrast, the state-of-art ETOX-based NOR still needs to have a boosted WL voltage greater than 4.0V in low-VDD Read operation because its two Vt values are too high. Typically, the two Vt values are set to be Vt1=2.0V and Vt2=4.0V at 45 nm node due to the long-held over-erasure concern. Thus the ETOX-based NOR design is not suitable for performing CAM cell's Compare function at a power voltage VDD below 5.0V.

According to an embodiment of the present invention, the 2T-string NOR-based TCAM cell's Vt distribution also has advantages over the ETOX-based NOR design as explained below with reference to FIG. 5C and FIG. 5E. The 2T-string NOR-based TCAM cell uses NAND paired cells (as referred below as NAND-based NOR) with three complementary lower Vt states, Vt0, Vt0, and Vt2, as compared with the two Vt states of the ETOX-based NOR cell, Vt1 and Vt2.

In a specific embodiment, the Vt0 state of each NAND flash transistor in the 2T-string NOR-based TCAM cell of this invention is preferably set to be a negative value smaller than ground voltage level VSS and Vt1 state is set to be a positive value higher than the ground level VSS. For example, Vt0 is at −2.0V and Vt1 state is at 0.7V. Conversely, no Vt0 level is used in ETOX-based NOR due to an over-erasure concern, and the Vt1 value of the ETOX-based NOR is set to much higher than 0.7V for the NAND-based NOR. The Vt1 in ETOX-based NOR is an erased state, while the Vt1 in this NAND-based NOR is a programmed state, which can be precisely tuned to a desired value within narrow-distribution of Vt1 on the bit-by-bit Program and Program-Verify scheme as popularly and reliably used in today's MLC NAND design:

$$Vt1=2.0\ V(\text{ETOX-based NOR})>Vt1=0.7\ V(\text{NAND-based NOR})$$

As a result, no boosted WL voltage is required when executing the NOR-based CAM Read and Compare functions even at a power voltage VDD as low as 1.2V.

Additionally, the CAM array operation for Compare function is explained below with reference to FIG. 5F of this invention. The vertical M-bit page of any one input Comparand word is loaded into the Search Word Register, 510, in the left. In a specific embodiment, the Search Word Register is preferably SARM-based devices with a FIFO depth of at least two to speed up the whole Compare operation. Multiple pages of Comparand words can be loaded into this Search Word FIFO Register 510 by the clock, CLK. Total M-bit inputs to the Search Word FIFO Register will generate M-bit complementary outputs, which are denoted as paired QM and QMB, based on a SRAM cell. Each paired outputs of QM and QMB are then coupled to each paired WLs such as WLM and WLMB. Totally, M paired Q and QB from the Search Word FIFO Register 510 would be connected to M paired horizontal WLM and WLMB of the M 2T-string NOR-based CAM cell array 540.

As shown in FIG. 5F, the array 540 of this sector 600 is organized in 2M rows of horizontal WLs and N columns of vertical LBLs and vertical LSLs. The total CAM cell bits in one sector 600 are M×N logic bits but the total NAND cell bits in one sector 600 are 2M×N physical bits because each NOR-based CAM cell of the present invention has two physical NAND cells which are connected in series.

During the Compare operation, the local vertical BL, LBLi (i=1, ..., N), is pre-charged to a desired high level, which can be VDD-Vt depending on the Vt level of two NAND cells for each CAM cell, and the global BL, GBLi (i=1, ..., N), has to be charged to VDD. In addition, the local SL, LSLi (i=1, ..., N), and global SL, GSL, have to be coupled to a low voltage level, which is VSS in this case. The individual global GBL is thus defined as one ML for each vertical M-logic-bit Comparand word or page. In one sector, there are total N MLs.

During the Compare operation, the data content of one page of M-logic-bit Comparand at the output of Search FIFO Register 510 is compared against the N pages of Words stored in the CAM cell array 540 of the CAM sector 600 on the same time. The CAM cells in the most left of the CAM sector 600 will be the first one to react to the Compare command due to shortest WL delay. The far right end of CAM sector 600 would be the last one to perform the Compare function.

In the conventional NAND-based BCAM array (see FIG. 4B), the long horizontal poly2-WL is not metal-strapped due to tight 1λ pitch, thus the WL delay from far left to far right may take much longer time (>few μs) when WL becomes narrower in cell's channel length in an advanced NAND technology node such as a 20 nm node.

In an embodiment of this invention, as shown in FIG. 5A, the 2T-string NOR-based BCAM or TCAM cell, the WL layout has a room to be metal-strapped because of halved Contact room per one NAND cell for this 2T-string CAM cell so that the WL delay across one sector of the CAM array from far left to far right is less than 20 ns for performing one match function or multiple match functions simultaneously in whole sector 600 of NOR-based BCAM or TCAM array. The Compare speed of this 2T-string NOR-based BCAM cell design according to an embodiment of the present invention potentially achieves 20× faster in Compare function speed compared to any rivaled NAND-based BCAM cells in prior art.

Furthermore, the ML of BL sensing delay of the NOR-based BCAM sector 600 in Compare operation will be explained below with reference to FIG. 5F of this invention.

Unlike the VM-based CAM memory, the logic match of conventional NAND-based CAM string is defined when each pre-charged global BL at VDD level is discharged to VSS level when all M-bit Comparand word is matched to the NAND page data stored in each NAND string. After the Compare operation, if no-match is found in each string, then each global BL stays high at VDD level. Conversely, when the logic match is found in each string, then the global BL voltage will be pulled to VSS.

In the VM-based CAM, DRAM-based CAM, and SRAM-based CAM, after the Compare operation, if no-match is found in each string, then each global BL stays at VSS level. Conversely, when the logic match is found in each string, then the global BL voltage will be at VDD. In other words, those belong to a kind of Parallel NOR-array, while the above NAND-based CAM is Serial NAND-array. Thus, the ML logic definition NOR-array and NAND-array for logic match and no-match is opposite. Thus the ML circuit has to be readjusted accordingly from the VM-based CAM to the NAND-based CAM.

In the conventional NAND-based CAM sector (see FIG. 4B), the logic matching of incoming M-bit Comparand page word to each stored (logic) page data occurs when all M-paired NAND cells in one NAND string are in conducting state that makes current flowing from the bottom BL node to the top SL node through the bottom ST transistor and top ST transistor, thereby pulling the corresponding GBL to low.

As to the 2T-string NOR-based CAM cell according to current invention, it is a kind of NOR-array but with NAND cell structure. The one pair of NAND cells of each CAM cell can be assigned with certain Vt states to define a first logic state "0" or second logic state "1". Each incoming Comparand word is represented by a pair of word lines in respective selected ground VSS and a complementary VDD levels which are selected to control the on or off of the corresponding pair of NAND cells. In a specific embodiment, by definition the logic matching of the incoming single bit Comparand word with the stored (logic) word in the CAM cell yields a "Yes" when the single logic-bit match is found with the CAM cell is at no conduction state. This is true when any one of the two NAND cells is in non-conduction state as they are connected in series. Conversely, the logic matching yields "No" when no-match is found with the CAM cell in conduction state. This is true only when both NAND cells are in conduction state. Depending on the logic state "0" or "1" defined by Vt states of the two NAND cells, the Vt values are properly selected based on Vt0<VSS<Vt1<VDD so that the pair of WL with either VSS and VDD assigned values is just able to determine the on/off state for the two NAND cells as described above so does the Compare operation for the single logic-bit match is justified.

For the Compare operation for the whole vertical page, the incoming M-bit Comparand word (a page) is compared to stored page word (defined by corresponding logic states of each corresponding NAND cells). Again, the logic match is found, or "Yes" is determined, when all the M 2T-string NOR-based CAM cells in each string are in non-conduction state that makes no current flowing from the bottom BL node to the top SL node, thereby retaining the corresponding GBL at high. In other words, for each 2T-string NOR-based CAM cell throughout the string, at least one NAND cell therein is in non-conduction state. If the logic match is found, then the ML corresponding to the string stays at high level of VDD. This only happens when all M paired CAM cells are all in off-state as oppose to all in on-state for conventional NAND-based CAM cell's operation. When one or more of the 2T-string NOR-based CAM cells are not matched (i.e., they are in conduction state), the whole string would be conduction state and the ML would be pulled low.

In a specific embodiment, the fastest NOR-based BCAM cell structure preferably has one-paired 2T NAND cells connected in series. This is referred as a 2T-string BCAM cell. But for further reducing the vertical Comparand length to save more silicon area in Y-direction, two paired 4T NAND cells in series can be used to cut the equivalent cell size by ~30% to save two Contact layout areas in each CAM cell. This is referenced as a 4T2b CAM cell string. The longest string of this NOR-based CAM can be made identical one as the conventional NAND-based CAM with total 2M NAND cells connected in series. The major different is that the conventional NAND-based CAM cell string has one local vertical BL and one horizontal but shared SL. Conversely, this longest NOR-based 2MTMb CAM cell string has made both local BL and local SL in parallel running in same Y-direction.

Moreover, the BL discharge speed in the Compare operation of the CAM cell would be explained in details below. For both NAND-based CAM and NOR-based CAM, the different of BL capacitance is about 30% in Y-direction (string). The BL length of the NAND-based CAM string is shorter than that of the NOR-based CAM string due to that there is no Contact layer inserted between any two adjacent NAND-based CAM cells in the same string. But the BL resistance is much higher in the NAND-based CAM string over the NOR-based CAM string. Since NAND-based CAM string has M paired CAM cells in series, while NOR-based CAM cell has only one paired CAM cell between the relevant Contact nodes. As a result, the NOR-based CAM BL resistance is 1/M of the counterpart of NAND-based CAM. The total BL-RC delay comparison is roughly expressed below:

BL-RC delay of NOR-based CAM=(1/M)×0.3 of BL-RC delay of NAND-based CAM

The total one ML RC delay=one BL-RC delay+one WL-RC delay

As a combined RC-delay of matching result, the ML speed of the NOR-based CAM cells in Compare operation can be roughly made to be M times faster over the conventional NAND-based CAM cells. In the M×N matrix of 2T-string NOR-based BCAM cells, totally, there are N vertical match lines MLs for each M-bit incoming Comparand page word. All these MLs can be respectively determined with priority levels and are routed into the inputs of a Priority Encoder 520, as shown in FIG. 5F. The highest priority of ML can be defined as MLN that is generated from the last BLN at the far right of the selected CAM sector. Conversely, the least priority ML can be defined as ML1 that is generated from the first BL1 at the far left of the CAM sector or vice versa. In other words, the MLN is the highest priority ML, while the ML0 is the least priority ML in the selected CAM sector.

In another embodiment, the Compare operation may catch one or multiple matches when each M-logic-bit Comparand vertical page data is compared against to the N vertical M-bit pages in the NOR-based CAM sector 600 of the present invention. The global Hit signal will be asserted (see FIG. 5F) when at least one local M-logic-bit match is found with corresponding match line MLN. The total delay from the M-bit inputs to the Hit Line of the Match operation of this M×N 2T-string NOR-based CAM sector can possibly be done within a period less than 100 ns for CAM density as high as 16 Gb. The whole Compare function of each 2T-string NOR-based CAM logic cell does not require any boosted WL voltage at all. As a result, a low-current, low-cost, fast-speed, and extremely-high-density CAM cell operation can be achieved at VDD power level as low as 1.2V.

The above descriptions about the NOR-based CAM cell operation are associated with BCAM cells when each 2T-string CAM cell's stored Vt states are set to two levels one negative value such as Vt0=−2.0V and one positive value such as Vt1=0.7V. When one single logic-bit is matched, the CAM cell is in an off-state (non-conduction) for either at logic state "0" or "1". When the CAM logic bit is not matched, then the CAM cell is in an on-state (conduction).

As explained before, the same 2T-string BCAM cell with two stored Vt states of Vt0=−2.0V and Vt1=0.7V of this NOR-based BCAM can be converted into a NOR-based TCAM by increasing the stored Vt states from two to three by adding a Vt2 level which is limited by Vt0<VSS<Vt1<VDD<Vt2. For each NAND cell, this is associated with a third physical state. For each 2T-string CAM cell, a third logic state "X" is defined when any one NAND cell among the two NAND cells is assigned to Vt2 level (with the other NAND cell in either Vt0, Vt1, or even at Vt2 levels). This Vt2 level is a specific value larger than the VDD level with a preferable sensing margin, for example, Vt2=+2.0V for VDD at 1.5 V or lower. With the three Vt states assignment and the paired WL complimentary VSS/VDD assignment, at least one NAND cell within a 2T-string NOR-based TCAM cell is always in a non-conduction state, making the TCAM cell in an off-state. For the logic match operation, the logic state "X" would yield a "don't care" result although the TCAM cell is in off-state equivalent to that when a single logic-bit match is found for either logic state "0" or "1". For the whole sector of M 2T-string NOR-based TCAM logic cell array, each CAM cell at logic state "X" always is in a non-conduction state, regardless of the input voltage combination for the paired WLM and WLMB. As a result, the BCAM and TCAM of this NOR-based CAM cell sector are organized with the same number of NAND flash transistors in same flash bits in 2M WLs and N BLs and N SLs.

In another embodiment, the MASK of input M-bit function on any individual bit of the M-bit Comparand can be flexibly set, as explained below with reference to the FIG. 5F. The number of MASK bits varies from 1 to K. No extra circuit changes are required. The MASK is implemented in NOR-based CAM array, 540, rather than in Search Word FIFO, 510, so that no circuit changes for simplicity. This is done by changing one of the two Vt states of each NAND cell, for example, from Vt0=−2.0V or Vt1=0.7V to Vt2=+2.0V. As long as the Vt2 value is higher than VDD, then the BCAM cell would not be turned on at all to pull down the global BLN, which is also the MLN, no matter what the VSS or VDD level representing Logic "0" or Logic "1" input is coupled to any WLM and WLMB pairs. In this 2T-string NOR-based CAM logic cell design according to an embodiment of the present invention, as long as the selected BLN cannot be pulled down, this BLN becomes a "don't care" state for the corresponding MLN. The "don't-care" state of BLN means that the sector does not care of a third Logic input of the selected CAM cell. That is equivalent to TCAM operation.

In another specific embodiment of the present invention, there are two preferred ways to change one of two Vt states of each NAND cell from Vt0 or Vt1 to Vt2 level to convert a BCAM cell into a TCAM cell of this NOR-based CAM sector. One preferred approach is to change only the top NAND cell MT's Vt to Vt2 but keep the bottom NAND cell MB's Vt as it is.

For example, assuming the bottom NAND cell MB's Vt is Vt1 of 2T-string BCAM cell, then the top NAND cell MT's Vt is complementary, thus is Vt0. When changing this BCAM cell to TCAM cell, the bottom NAND cell MB's Vt is still kept as it is, which is Vt1, but now the top NAND cell MT's Vt level is increased from Vt0 to Vt2.

Conversely, assuming the bottom NAND cell MB's Vt is Vt0 of 2T-string BCAM cell, then the top NAND cell MT's Vt is complementary, thus is Vt1. When changing this BCAM cell to TCAM cell, the bottom NAND cell MB's Vt is still kept as it is, which is Vt0, but now the top NNAD cell MT's Vt level is increased from Vt1 to Vt2.

Both of the two above disclosed approaches have the same result to convert the BCAM cell into the TCAM cell from M-bit Comparand word logic matching viewpoint.

In yet another embodiment, the sector of 2MTMb NOR-based CAM cell array, as shown in FIG. 5F, can be configured to be a preferred sector of a HCAM cell array that comprises a plurality of hybrid pages. HCAM stands for the NOR-based Hybrid CAM array. Some of HCAM pages can be programmed into TCAM pages, and the remaining of whole HCAM pages CAM pages can be programmed into NOR-based BCAM pages. The number of transistors of both BCAM and TCAM pages and the WL decoders are kept identical. The BCAM and TCAM cell strings within the HCAM sector can still be functioned as the above described BCAM and TCAM cells for corresponding Compare operations with M-bit match capability and N MLs for N pages of Comparand words. The BCAM and TCAM pages can be flexibly mixed in arbitrary manner in terms of the page numbers and the page physical location. One or multiple matches can be found in BCAM, TCAM and HCAM sectors of the present invention.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A 2T-string NOR-based CAM logic cell circuit with NAND scalability, the 2T-string NOR-based CAM logic cell comprising:
   a first NAND flash transistor connected a second NAND flash transistor in series, the first NAND flash transistor including a first gate coupled to a first word line and a drain node coupled to a vertical bit line, the second NAND flash transistor including a second gate coupled to a second word line and a source node coupled to a vertical source line, each of the first NAND flash transistor and the second NAND flash transistor being associated with at least a first threshold voltage level Vt0 of a negative value corresponding to a first physical state or a second threshold voltage level Vt1 of a positive value but smaller than power voltage level VDD corresponding to a second physical state;
   wherein the first NAND flash transistor and the second NAND flash transistor respectively corresponding to the first physical state and the second physical state define a first CAM logic state "0" and the first NAND flash transistor and the second NAND flash transistor being respectively associated with the second physical state and the first physical state define a second CAM logic state "1", the first word line and the second word line are respectively at either ground voltage VSS=0V level or the complementary VDD level for performing a compare operation to determine if a single logic-bit match is found at either one of the first CAM logic state "0" or the second CAM logic state "1" when one of the first NAND flash transistor and the second NAND flash transistor is in non-conduction state.

2. The 2T-string NOR-based CAM logic cell circuit of claim 1 wherein each of the first and second NAND flash transistors is a 2-poly floating-gate type NMOS transistor.

3. The 2T-string NOR-based CAM logic cell circuit of claim 1 wherein the first threshold voltage level Vt0 is set below the ground voltage VSS and the second threshold voltage level Vt1 is set greater than VSS and smaller than the power voltage VDD based on Vt0<VSS<Vt1<VDD.

4. The 2T-string NOR-based CAM logic cell circuit of claim 1 wherein the single logic-bit match at the first CAM logic state "0" is found if the first word line is at the power voltage VDD level and second word line is at the complementary 0V and no-match is found if the first word line is at 0V and second word line is at the complementary VDD level.

5. The 2T-string NOR-based CAM logic cell circuit of claim 1 wherein the single logic-bit match at the first CAM logic state "1" is found if the first word line is at 0V and second word line is at the complementary VDD level and no-match is found if the first word line is at the VDD level and second word line is at the complementary 0V.

6. The 2T-string NOR-based CAM logic cell circuit of claim 1 wherein the single logic-bit is not matched when both the first NAND flash transistor and the second NAND flash transistor are in conduction state.

7. The 2T-string NOR-based CAM logic cell circuit of claim 1 wherein at least one of the first NAND flash transistor and the second NAND flash transistor is further assigned with a third threshold voltage level Vt2 for defining a third CAM logic state "X", the Vt2 level being selected to be a positive value greater than the power voltage VDD level based on Vt0<VSS<Vt1<VDD<Vt2.

8. The 2T-string NOR-based CAM logic cell circuit of claim 7 wherein the third CAM logic state "X" is further associated with a physical state that both the first NAND flash transistor and the second NAND flash transistor are assigned with the third threshold voltage level Vt2 greater than the VDD level.

9. The 2T-string NOR-based CAM logic cell circuit of claim 7 wherein the single logic-bit match is determined to be "don't care" for the third CAM logic state X wherein a non-conduction state is always associated with at least one of the first NAND flash transistor and the second NAND flash transistor no matter what the first word line and the second word line are respectively at either VSS=0V level or the complementary VDD level during the compare operation.

10. The 2T-string NOR-based CAM logic cell circuit of claim 1 wherein the first physical state is associated with an erased state for any one of the first NAND flash transistor and the second NAND flash transistor and the second physical state is associated with a programmed state for any one of the first NAND flash transistor and the second NAND flash transistor by precharging from the vertical bit line.

11. A sector of M×N 2T-string NOR-based CAM logic cell array comprising:
    a M×N matrix of 2T-string NOR-based CAM logic cells including M paired horizontal word lines coupled through N vertical pages, M and N being properly selected integer numbers, each paired horizontal word lines including a first word line and a second word line, each of the N vertical pages including M 2T-string NOR-based CAM logic cells connected in parallel sharing a vertical local bit line and a vertical local source line, the vertical local source line being accessed by a horizontal global source line via a first select transistor commonly for the N vertical pages and the vertical local bit line being accessed by a vertical global bit line via a second select transistor individually for each of the N vertical page, each of the M 2T-string NOR-based CAM logic cells comprising:
       a first NAND flash transistor connected a second NAND flash transistor in series, the first NAND flash transistor including a first gate coupled to the first word line and a drain node coupled to the vertical local bit line, the second NAND flash transistor including a second gate coupled to the second word line and a source node coupled to the vertical local source line, each of the first NAND flash transistor and the second NAND flash transistor being associated with at least a first threshold voltage level Vt0 of a negative value corresponding to a first physical state or a second threshold voltage level Vt1 of a positive value corresponding to a second physical state, wherein the first NAND flash transistor and the second NAND flash transistor being respectively associated with the first physical state and the second physical state define a first CAM logic state "0" and the first NAND flash transistor and the second NAND flash transistor being respectively associated with the second physical state and the first physical state define a second CAM logic state "1";
    a search word device configured to generate at least M-bit logic outputs, the M pairs of outputs being respectively coupled to the M paired horizontal word lines, each pair of outputs being either at a ground voltage VSS=0V or at a complementary power voltage VDD level for initiating a compare operation to determine if a single logic-bit match is found for each of the M 2T-string NOR-based CAM logic cells at any one of the first CAM logic state "0" and the second CAM logic state "1" when one of the first NAND flash transistor and the second NAND flash transistor is in non-conduction state;

a priority decoder device configured to receive N vertical global bit lines respectively associated with the N vertical pages as N match lines for sending a match information to a hit line if at least one M-logic-bit match is found for one vertical page with all the M 2T-string NOR-based CAM logic cells respectively at either one of the first CAM logic state "0" or the second CAM logic state "1" and generating a priority list if multiple matches are found respectively for corresponding multiple vertical pages; and a Comparand address generator device coupled to the N match lines and received the match information from the N match lines and the hit line to generate an address list associated with one or more vertical pages having the at least one M-logic-bit match or one or more partial matches depending on the priority list.

12. The sector of M×N 2T-string NOR-based CAM logic cell array of claim 11 wherein each of the first NAND flash transistor and second NAND flash transistor is a 2-poly floating-gate type NMOS transistor.

13. The sector of M×N 2T-string NOR-based CAM logic cell array of claim 11 wherein the first physical state is associated with an erased state for each of the first NAND flash transistor and the second NAND flash transistor, the second physical state is associated with a programmed state for each of the first NAND flash transistor and the second NAND flash transistor precharged from the vertical local bit line through the vertical global bit line.

14. The sector of M×N 2T-string NOR-based CAM logic cell array of claim 11 wherein each of the M 2T-string NOR-based CAM logic cells is a 2T-string NOR-based Binary CAM (BCAM) logic cell wherein each of the first NAND flash transistor and the second NAND flash transistor is assigned the first threshold voltage level Vt0 and the second threshold voltage level Vt1 that are limited by Vt0<VSS<Vt1<VDD for the 2T-string NOR-based BCAM logic cell operated with the power voltage VDD.

15. The sector of M 2T-string NOR-based CAM logic cell array of claim 14 wherein the single logic-bit match is found for the 2T-string NOR-based BCAM logic cell at the first CAM logic state "0" if a first word line is at the VDD level and second word line is at the complementary 0V and no-match is found if the first word line is at 0V and second word line is at the complementary VDD level.

16. The sector of M×M 2T-string NOR-based CAM logic cell array of claim 14 wherein the single logic-bit match is found for the 2T-string NOR-based BCAM logic cell at the first CAM logic state "1" if the first word line is at 0V and second word line is at the complementary VDD level and no-match is found if the first word line is at the VDD level and second word line is at the complementary 0V.

17. The sector of M×N 2T-string NOR-based CAM logic cell array of claim 14 wherein the single logic-bit match is not found for the 2T-string NOR-based BCAM logic cell at any one of the first CAM logic state "0" and the second CAM logic state "1" when both the first NAND flash transistor and the second NAND flash transistor are in conduction state.

18. The sector of M×N 2T-string NOR-based CAM logic cell array of claim 17 wherein the at least one M-logic-bit match is found for one of the N vertical pages when all single logic-bit matches are found for each of the corresponding M 2T-string NOR-based BCAM logic cells at any one of the first CAM logic state "0" and the second CAM logic state "1" to make the corresponding vertical page in non-conduction state and maintain the corresponding vertical global bit line at a high voltage level, or not found when at least a no-match is found for one of the M 2T-string NOR-based BCAM logic cells to make the corresponding vertical page in conduction state with the corresponding global bit line pulled to a low voltage level.

19. The sector of M×N 2T-string NOR-based CAM logic cell array of claim 18 wherein the corresponding vertical page in non-conduction state is associated with a non-conduction state for each of the M 2T-string NOR-based BCAM logic cells wherein at least one of the first NAND flash transistor and the second NAND flash transistor is in non-conduction state.

20. The sector of M×N 2T-string NOR-based CAM logic cell array of claim 18 wherein the corresponding vertical page in conduction state is associated with at least a conduction state for one of the M 2T-string NOR-based BCAM logic cells wherein both the first NAND flash transistor and the second NAND flash transistor are in conduction state.

21. The sector of M×N 2T-string NOR-based CAM logic cell array of claim 11 wherein each of the M 2T-string NOR-based CAM logic cells is a 2T-string NOR-based Ternary CAM (TCAM) logic cell wherein at least one of the first NAND flash transistor and the second NAND flash transistor is further assigned with a third threshold voltage level Vt2 for defining a third CAM logic state "X", the Vt2 level being selected to be a positive value greater than the VDD level based on Vt0<VSS<Vt1<VDD<Vt2.

22. The sector of M×N 2T-string NOR-based CAM logic cell array of claim 21 wherein the third CAM logic state "X" is further associated with a physical state that both the first NAND flash transistor and the second NAND flash transistor in the 2T-string NOR-based TCAM logic cell are assigned with the third threshold voltage level Vt2 greater than the VDD level.

23. The sector of M×N 2T-string NOR-based CAM logic cell array of claim 21 wherein the single logic-bit match is determined to be "don't care" for the 2T-string NOR based TCAM logic cell at the third CAM logic state "X" wherein a non-conduction state is always associated with at least one of the first NAND flash transistor and the second NAND flash transistor no matter what the first word line and the second word line are respectively at either VSS=0V level or the complementary VDD level during the compare operation.

24. The sector of M×N 2T-string NOR-based CAM logic cell array of claim 21 wherein the at least one M-bit match is found for one of the N vertical pages when all single logic-bit matches are found for each of the corresponding M 2T-string NOR-based TCAM logic cells at any one of the first CAM logic state "0" and the second CAM logic state "1" to make the corresponding vertical page in non-conduction state with the corresponding vertical global bit line stayed at a high voltage level, or not found when at least a no-match is found for one of the M 2T-string NOR-based TCAM logic cells to make the corresponding vertical page in conduction state with the corresponding vertical global bit line pulled to a low voltage level.

25. The sector of M×N 2T-string NOR-based CAM logic cell array of claim 21 wherein a partial match is found for one of the N vertical pages when a single logic-bit match is found for each of K number of logic cells among the corresponding M 2T-string NOR-based TCAM logic cells, K is an integer selected from 1 through M−1, at any one of the first CAM logic state "0" and the second CAM logic state "1" and a single logic-bit match is determined as "don't care" for each of rest M−K number of logic cells among the corresponding M 2T-string NOR-based TCAM logic cells at the third CAM logic state "X" to make the corresponding vertical page in non-conduction state with the corresponding vertical global bit line stayed at a high voltage level.

26. The sector of M×N 2T-string NOR-based CAM logic cell array of claim 25 wherein the multiple matches found respectively for corresponding multiple vertical pages comprise one or more partial matches respectively associated with one or more vertical pages within the corresponding multiple vertical pages wherein for each vertical page a single logic-bit match is found for each of K number of logic cells among the corresponding M 2T-string NOR-based TCAM memory cells at any one of the first CAM logic state "0" and the second CAM logic state "1", K being an integer selected from 1 through M−1, and a single logic-bit match is determined as "don't care" for each of M−K number of logic cells among the corresponding M 2T-string NOR-based TCAM logic cells at the third CAM logic state "X" to make the corresponding vertical page in non-conduction state with the corresponding vertical global bit line stayed at a high voltage level, and at least one M-bit match for one vertical page among the corresponding multiple vertical pages wherein single-bit matches are found for all the corresponding M 2T-string NOR-based TCAM logic cells at any one of the first CAM logic state "0" and the second CAM logic state "1" to make the corresponding vertical page in non-conduction state with the corresponding vertical global bit line stayed at a high voltage level.

27. The sector of M×N 2T-string NOR-based CAM logic cell array of claim 11 wherein the M 2T-string NOR-based CAM logic cells for each of the N vertical pages are arranged by K number of 2T-string NOR-based BCAM logic cells each including a first NAND flash transistor and a second NAND flash transistor connected in series, K being one integer selected from 0 through M, wherein each of the first NAND flash transistor and the second NAND flash transistor being assigned a first threshold voltage level Vt0 and a second threshold voltage level Vt1 that are selected based on Vt0<VSS<Vt1<VDD, and M−K number of 2T-string NOR-based TCAM logic cells each including a third NAND flash transistor and a fourth NAND flash transistor connected in series, wherein at least one of the third NAND flash transistor and the fourth NAND flash transistor being assigned the first threshold voltage level Vt0 and the second threshold voltage level Vt1 and further with a third threshold voltage level Vt2 that are selected based on Vt0<VSS<Vt1<VDD<Vt2.

28. The sector of M×N 2T-string NOR-based CAM logic cell array of claim 27 wherein each of the K 2T-string NOR-based BCAM logic cells and each of the M−K 2T-string NOR-based TCAM logic cells have the same number of NAND flash transistors.

29. The sector of M×N 2T-string NOR-based CAM logic cell array of claim 27 wherein the K 2T-string NOR-based BCAM logic cells and the M−K 2T-string NOR-based TCAM logic cells are arbitrarily arranged in the corresponding one of the N vertical pages.

30. The sector of M×N 2T-string NOR-based CAM logic cell array of claim 27 wherein each pair of the M paired horizontal word lines are respectively assigned to either the ground voltage level VSS of 0V or the complementary level VDD without need of any WL voltage booster.

31. The sector of M×N 2T-string NOR-based CAM logic cell array of claim 11 wherein the search word device comprises a SRAM-based data register for converting every 2 bits physical input data to a 1-bit logic word input following a FIFO I/O mechanism have a depth of at least two and providing to select gate signal for initiating the compare operation between the M logic-bits word page to stored word page in the selected one of the N vertical pages.

* * * * *